(12) United States Patent
Walton et al.

(10) Patent No.: US 10,468,118 B2
(45) Date of Patent: Nov. 5, 2019

(54) DRAM ROW SPARING

(71) Applicant: HEWLETT PACKARD ENTERPRISE DEVELOPMENT LP, Houston, TX (US)

(72) Inventors: Andrew C. Walton, Rocklin, CA (US); Melvin K. Benedict, Magnolia, TX (US); Eric L. Pope, Tomball, TX (US); Erin A. Handgen, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 130 days.

(21) Appl. No.: 15/115,971

(22) PCT Filed: Mar. 3, 2014

(86) PCT No.: PCT/US2014/019801
§ 371 (c)(1),
(2) Date: Aug. 2, 2016

(87) PCT Pub. No.: WO2015/133982
PCT Pub. Date: Sep. 11, 2015

(65) Prior Publication Data
US 2017/0169905 A1 Jun. 15, 2017

(51) Int. Cl.
*G11C 29/00* (2006.01)
*G06F 11/10* (2006.01)
(Continued)

(52) U.S. Cl.
CPC .............. *G11C 29/78* (2013.01); *G06F 3/065* (2013.01); *G06F 3/0619* (2013.01);
(Continued)

(58) Field of Classification Search
CPC ......... G11C 29/78; G11C 17/16; G11C 11/40; G11C 29/42; G11C 29/44; G11C 29/783;
(Continued)

(56) References Cited

U.S. PATENT DOCUMENTS 7,895,374 B2   2/2011   Ferraiolo et al.
7,984,329 B2   7/2011   Lastras-Montano et al.
(Continued)

OTHER PUBLICATIONS

Yung-Fa Chou et al., "Reactivation of Spares for Off-Chip Memory Repair After Die Stacking in a 3-D IC With TSVs", In: IEEE Transactions on Circuits and Systems-I: Regular Papers, vol. 60, No. 9, Sep. 2013, pp. 2343-2351, See p. 2344, left column, lines 1-13: and figure 2.

(Continued)

*Primary Examiner* — Christine T. Tu
(74) *Attorney, Agent, or Firm* — Hewlett Packard Enterprise Patent Department

(57) ABSTRACT

Example implementations relate to dynamic random-access memory (DRAM) row sparing. In example implementations, utilization of a failed row of a DRAM device may be excluded. A fuse in the DRAM device may be blown to replace the failed row with a spare row. The fuse may be blown during runtime operation of the DRAM device. Error-correcting code (ECC) may be used to correct erroneous data from the failed row while the fuse is being blown. Accesses of the failed row may be redirected to the spare row after the fuse is blown.

20 Claims, 15 Drawing Sheets

(51) Int. Cl.
*G11C 29/42* (2006.01)
*G11C 29/44* (2006.01)
*G06F 3/06* (2006.01)
*G11C 17/16* (2006.01)
*G06F 12/02* (2006.01)
*G06F 12/06* (2006.01)
*G11C 11/40* (2006.01)
*G11C 29/04* (2006.01)

(52) U.S. Cl.
CPC .......... *G06F 3/0656* (2013.01); *G06F 3/0683* (2013.01); *G06F 11/1008* (2013.01); *G06F 11/1048* (2013.01); *G11C 17/16* (2013.01); *G11C 29/42* (2013.01); *G11C 29/44* (2013.01); *G11C 29/783* (2013.01); *G11C 29/808* (2013.01); *G06F 12/02* (2013.01); *G06F 12/0638* (2013.01); *G11C 11/40* (2013.01); *G11C 2029/0411* (2013.01); *G11C 2229/743* (2013.01); *G11C 2229/763* (2013.01)

(58) Field of Classification Search
CPC .......... G11C 29/808; G11C 2029/0411; G11C 2229/743; G11C 2229/763; G06F 3/0619; G06F 3/0656; G06F 3/0683; G06F 11/1008; G06F 3/065; G06F 11/1048; G06F 12/02; G06F 12/0638
See application file for complete search history.

(56) References Cited

U.S. PATENT DOCUMENTS

| | | |
|---|---|---|
| 2003/0081386 A1 | 5/2003 | Barth et al. |
| 2003/0084386 A1 | 5/2003 | Barth et al. |
| 2003/0147291 A1* | 8/2003 | Kim ................ G11C 29/785 365/200 |
| 2005/0240838 A1 | 10/2005 | Iwai |
| 2006/0168488 A1* | 7/2006 | Hill ................ G11C 17/143 714/718 |
| 2013/0111295 A1 | 5/2013 | Li et al. |
| 2013/0182489 A1 | 7/2013 | Wang |
| 2013/0254506 A1 | 9/2013 | Berke et al. |
| 2013/0329509 A1* | 12/2013 | Jung ................ G11C 29/785 365/200 |
| 2015/0155055 A1* | 6/2015 | Kim ................ G11C 17/16 365/96 |
| 2017/0229192 A1* | 8/2017 | Sohn ................ G11C 29/4401 |

OTHER PUBLICATIONS

Li, S, et al.; "MAGE: Adaptive Granularity and ECC for Resilient and Power Efficient Memory Systems"; Nov. 10-16, 2012; 11 pages.
Held, J.; "intel® Technology Journal Memory Resiliency"; Jun. 8, 2013; vol. 17; Issue: 1; 200 pages.
Casey M. Jeffery et al., "Hierarchical Fault Tolerance for Nonoscale Memories", In: IEEE Transactions on Nanotechnology, vol. 5, No. 4, Jul. 2006, pp. 407-414, See p. 409.
Tsu-Wei Tseng et al., "ReBISR: A Reconfigurable Built-In Self-Repair Scheme for Random Access Memories in SOCs", In: IEEE Transactions on Very Large Scale Integration (VLSI) Systems, Jun. 2010, vol. 18. No. 6. pp. 921-932, See p. 922, right column. lines 1-24: and figure 2.
International Searching Authority, The International Search Report and the Written Opinion, dated Nov. 27, 2014, 13 Pages.
International Preliminary Report on Patentability received in PCT Application No. PCT/US2014/019801, dated Sep. 15, 2016, 9 pages.

* cited by examiner

DRAM ROW SPARING

BACKGROUND

Dynamic random-access memory (DRAM) devices may store data in an array of memory cells. Spare rows in DRAM devices may be used to increase chip yield. If a DRAM manufacturer discovers a defect in a row of a DRAM device in a factory, a fuse in the DRAM device may be blown to map a spare row into the array and map the defective row out of the array.

BRIEF DESCRIPTION OF THE DRAWINGS

The following detailed description references the drawings, wherein.

DETAILED DESCRIPTION

As mentioned above, a fuse in a DRAM device may be blown in a factory to map out a defective row and map in a spare row. Some standards, such as the double data rate fourth generation (DDR4) standard, allow computer systems to map in spare rows at runtime by blowing a fuse. Blowing a fuse may take a long time (e.g., hundreds of milliseconds), and the behavior of a DRAM device while a fuse is being blown may be indeterminate, so an operating system (OS) may not be able to use a DRAM device in which a fuse is being blown. An OS that supports runtime blowing of a fuse may evacuate applications out of a DRAM device having a defective row while a fuse is being blown in the DRAM device. The OS may move data that is on the DRAM device to other memory regions so that applications may continue to use the data. However, not all OS's support runtime blowing of a fuse, and even OS's that do support such a feature may not be able to preclude applications that have "pinned" memory from using a defective region of memory, or may not have time to free a defective region of memory for sparing.

In light of the above, the present disclosure provides for replacement of a row of a DRAM device during runtime, even if applications continue to use the DRAM device while a fuse is being blown, and even without OS support of row sparing during runtime. Various error correction schemes (e.g., memory erasure, chip sparing) that are able to tolerate a failed DRAM device may be used to correct (or recreate) erroneous (or missing) data while a fuse is blown. Thus, replacement of a defective row of a DRAM device during runtime may be transparent to applications that are running, and may also be transparent to an OS that does not support row sparing during runtime.

Figure 1:
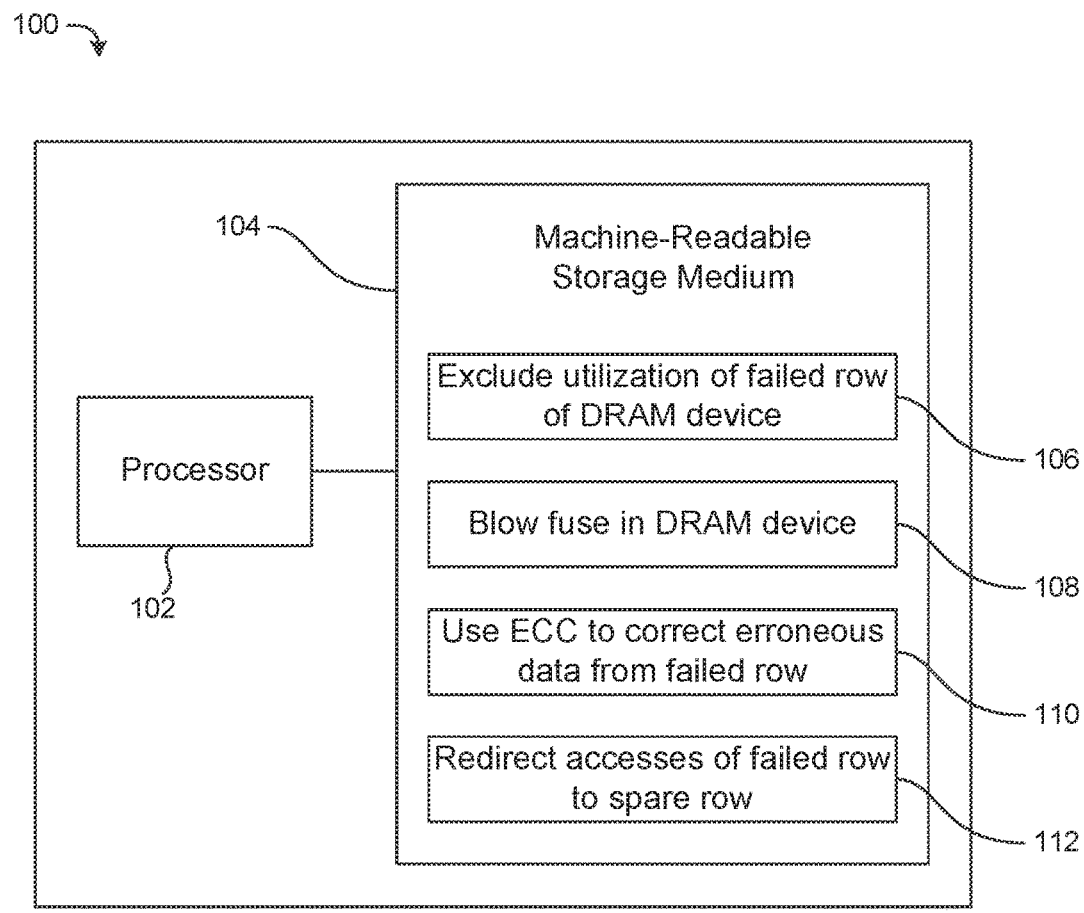
FIG. 1 is a block diagram of an example memory controller that includes a machine-readable storage medium encoded with instructions that enable DRAM row sparing.

Referring now to the drawings, FIG. 1 is a block diagram of an example memory controller 100 that includes a machine-readable storage medium encoded with instructions that enable DRAM row sparing. As used herein, the terms "include", "have", and "comprise" are interchangeable and should be understood to have the same meaning. Memory controller 100 may be communicatively coupled to a memory module, such as a single in-line memory module (SIMM) or a dual in-line memory module (DIMM). In FIG. 1, memory controller 100 includes processor 102 and machine-readable storage medium 104.

Processor 102 may include a central processing unit (CPU), microprocessor (e.g., semiconductor-based microprocessor), and/or other hardware device suitable for retrieval and/or execution of instructions stored in machine-readable storage medium 104. Processor 102 may fetch, decode, and/or execute instructions 106, 108, 110, and 112 to enable DRAM row sparing, as described below. As an alternative or in addition to retrieving and/or executing instructions, processor 102 may include an electronic circuit comprising a number of electronic components for performing the functionality of instructions 106, 108, 110, and/or 112.

Machine-readable storage medium 104 may be any suitable electronic, magnetic, optical, or other physical storage device that contains or stores executable instructions. Thus, machine-readable storage medium 104 may include, for example, a random-access memory (RAM), an Electrically Erasable Programmable Read-Only Memory (EEPROM), a storage device, an optical disc, and the like. In some implementations, machine-readable storage medium 104 may include a non-transitory storage medium, where the term "non-transitory" does not encompass transitory propagating signals. As described in detail below, machine-readable storage medium 104 may be encoded with a set of executable instructions 106, 108, 110, and 112.

Instructions 106 may exclude, during runtime operation of a DRAM device, utilization of a failed row of the DRAM device. The term "failed row" as used herein refers to a region of memory that repeatedly does not accurately store data written to the region, and/or repeatedly does not accurately output stored data when a read operation is performed on the region. In some implementations, a region of memory may be designated as a failed row if the number of errors associated with the region (e.g., the number of times data is incorrectly written to and/or read from the region) exceeds a threshold number of errors.

In some implementations, utilization of a failed row of a DRAM device may be excluded by temporarily replacing the DRAM device with another DRAM device. For example, an error correction scheme such as Double Chip Kill (DCK) may be used to temporarily map out the DRAM device having the failed row in favor of a spare DRAM device. In some implementations, utilization of a failed row of a DRAM device may be excluded by temporarily replacing the failed row with a row buffer. In some implementations, utilization of a failed row of a DRAM device may be excluded by ignoring data read from the DRAM device (e.g., memory erasure), without temporarily replacing the DRAM device or the failed row. Various techniques for excluding utilization of a failed row are discussed further below.

Instructions 108 may blow, during runtime operation of the DRAM device, a fuse in the DRAM device to replace the failed row with a spare row. Replacing a failed row with a spare row may also be referred to herein as "mapping in" a spare row. A spare row may be a redundant region of the DRAM device that may be accessed in the same manner as, and instead of, the failed row once the fuse is blown. A DRAM device may have multiple spare rows, allowing for multiple failed rows to be replaced.

Instructions 110 may use, while the fuse is being blown, error-correcting code (ECC) to correct erroneous data from the failed row. In some implementations, ECC may be used to correct erroneous data copied from the failed row to a spare DRAM device or to a row buffer, such that the spare DRAM device/row buffer stores accurate rather than erroneous data. In some implementations, ECC may be used to reconstruct data for a position in a cache line that includes erroneous data read from the DRAM having the failed row.

Instructions 112 may redirect, after the fuse is blown, accesses of the failed row to the spare row. Addresses/locations in the failed row may be mapped to corresponding addresses/locations in the spare row. After the fuse is blown, when memory controller 100 receives read commands directed at addresses/locations in the failed row, the corresponding addresses/locations in the spare row may be read instead of those in the failed row. Similarly, in response to write commands directed at addresses/locations in the failed row, memory controller 100 may instead write to the corresponding addresses/locations in the spare row.

Figure 2:
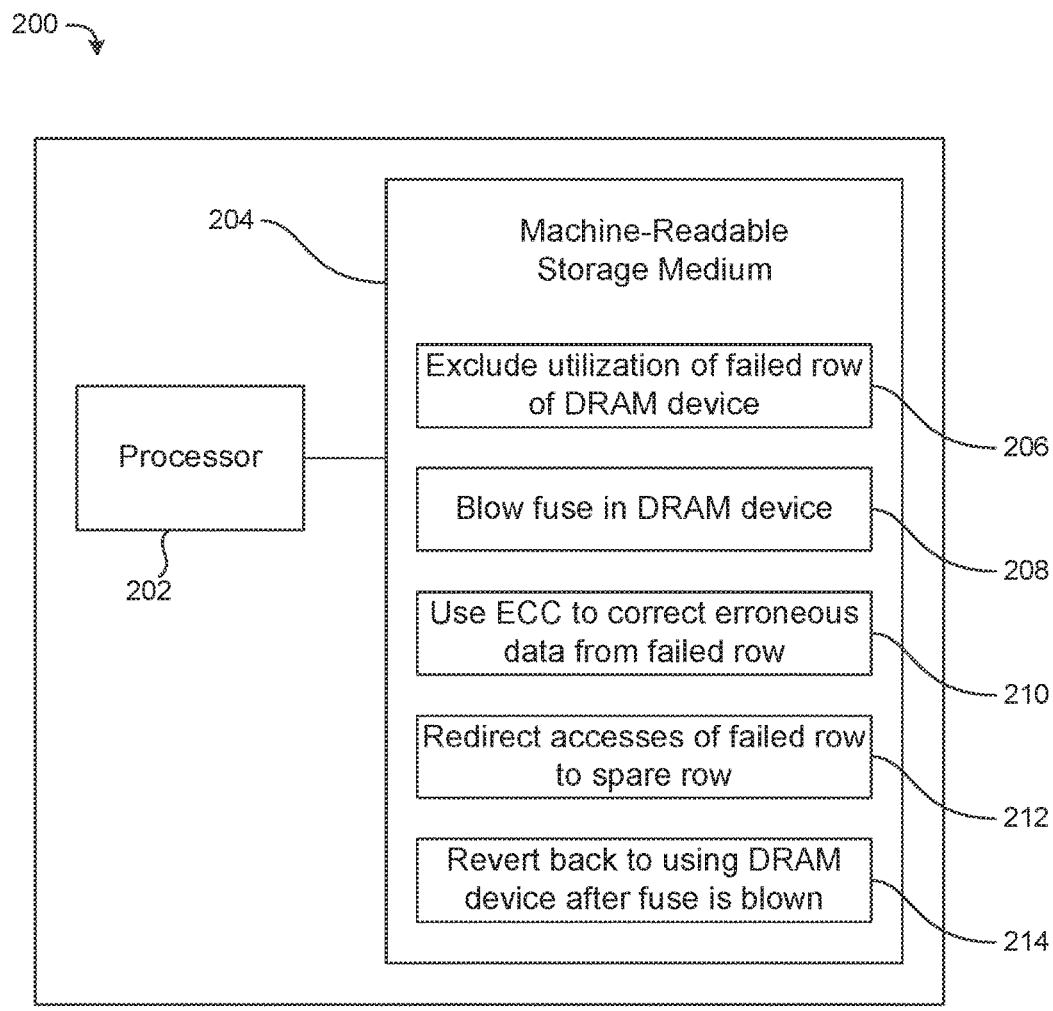
FIG. 2 is a block diagram of an example memory controller that includes a machine-readable storage medium encoded with instructions that enable sparing of a DRAM device.

FIG. 2 is a block diagram of an example memory controller 200 that includes a machine-readable storage medium encoded with instructions that enable sparing of a DRAM device. Memory controller 200 may be may be communicatively coupled to a memory module, such as a SIMM or DIMM. In FIG. 2, memory controller 200 includes processor 202 and machine-readable storage medium 204.

As with processor 102 of FIG. 1, processor 202 may include a CPU, microprocessor (e.g., semiconductor-based microprocessor), and/or other hardware device suitable for retrieval and/or execution of instructions stored in machine-readable storage medium 204. Processor 202 may fetch, decode, and/or execute instructions 206, 208, 210, 212, and 214 to enable sparing of a DRAM device, as described below. As an alternative or in addition to retrieving and/or executing instructions, processor 202 may include an electronic circuit comprising a number of electronic components for performing the functionality of instructions 206, 208, 210, 212, and/or 214.

As with machine-readable storage medium 104 of FIG. 1, machine-readable storage medium 204 may be any suitable physical storage device that stores executable instructions. Instructions 206, 208, 210, and 212 on machine-readable storage medium 204 may be analogous to (e.g., have functions and/or components similar to) instructions 106, 108, 110, and 112 on machine-readable storage medium 104. Instructions 206 may exclude utilization of a failed row of a first DRAM device of a plurality of DRAM devices. The first DRAM device may be replaced with a second DRAM device of the plurality of DRAM devices when the utilization of the failed row is excluded. For example, a Basic Input/Output System (BIOS) that controls memory controller 200 may invoke DCK, and the first DRAM device may be replaced with a second (e.g., spare) DRAM device while a fuse in the first DRAM device is blown to replace the failed row with a spare row. Data may be copied from the first DRAM device to the second DRAM device, and ECC may be used to correct/recreate erroneous and/or missing data in the second DRAM device.

Instructions 214 may revert back to using the first DRAM device after the fuse is blown. ECC may be used to correct/recreate erroneous and/or missing data in the spare row. In some implementations, instructions 214 may be executed without rebooting memory controller 200 (e.g., if a BIOS is able to reverse DCK chip-sparing during runtime). In some implementations, instructions 214 may be executed on reboot, and the first DRAM device with the mapped-in spare row may be initialized for use before an OS is loaded.

Figure 3:
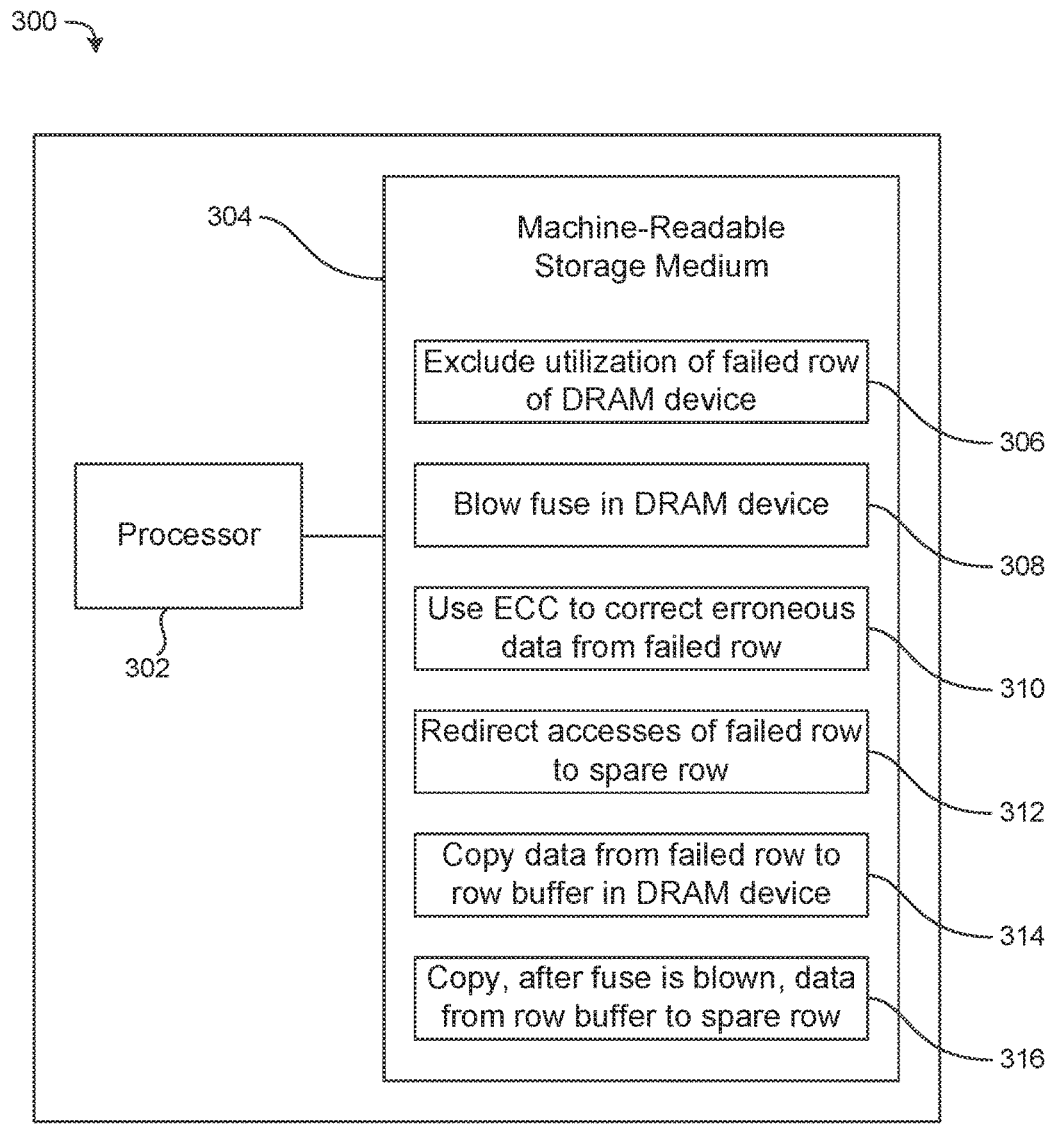
FIG. 3 is a block diagram of an example memory controller that includes a machine-readable storage medium encoded with instructions that enable use of a row buffer in a DRAM device.

FIG. 3 is a block diagram of an example memory controller 300 that includes a machine-readable storage medium encoded with instructions that enable use of a row buffer in a DRAM device. Memory controller 300 may be may be communicatively coupled to a memory module, such as a SIMM or DIMM. In FIG. 3, memory controller 300 includes processor 302 and machine-readable storage medium 304.

As with processor 102 of FIG. 1, processor 302 may include a CPU, microprocessor (e.g., semiconductor-based microprocessor), and/or other hardware device suitable for retrieval and/or execution of instructions stored in machine-readable storage medium 304. Processor 302 may fetch, decode, and/or execute instructions 306, 308, 310, 312, 314, and 316 to enable use of a row buffer in a DRAM device, as described below. As an alternative or in addition to retrieving and/or executing instructions, processor 302 may include an electronic circuit comprising a number of electronic components for performing the functionality of instructions 306, 308, 310, 312, 314, and/or 316.

As with machine-readable storage medium 104 of FIG. 1, machine-readable storage medium 304 may be any suitable physical storage device that stores executable instructions. Instructions 306, 308, 310, and 312 on machine-readable storage medium 304 may be analogous to instructions 106, 108, 110, and 112 on machine-readable storage medium 104. Instructions 314 may copy data from a failed row of a DRAM device to a row buffer in the DRAM device. Accesses of parts of the failed row that have been copied to the row buffer may be temporarily redirected to the row buffer. Accesses of the failed row may be redirected to the row buffer before copying of data from the failed row to the row buffer is completed; while copying is in progress, accesses of parts of the failed row that have been copied may be redirected to the row buffer, and accesses of parts of the failed row that have not been copied may still occur. The row buffer may be used instead of the failed row while a fuse in the DRAM device is being blown to replace the failed row with a spare row of the DRAM device.

Instructions 316 may copy, after the fuse is blown, data from the row buffer to the spare row. Accesses of parts of the failed row that have been copied from the row buffer to the spare row may be redirected to the spare row. Accesses of the failed row may be redirected to the spare row before copying of data from the row buffer to the spare row is completed; while copying is in progress, accesses of parts of the failed row that have been copied from the row buffer to the spare row may be redirected to the spare row, and accesses of parts of the failed row that have not been copied from the row buffer to the spare row may be redirected to the row buffer.

Figure 4:
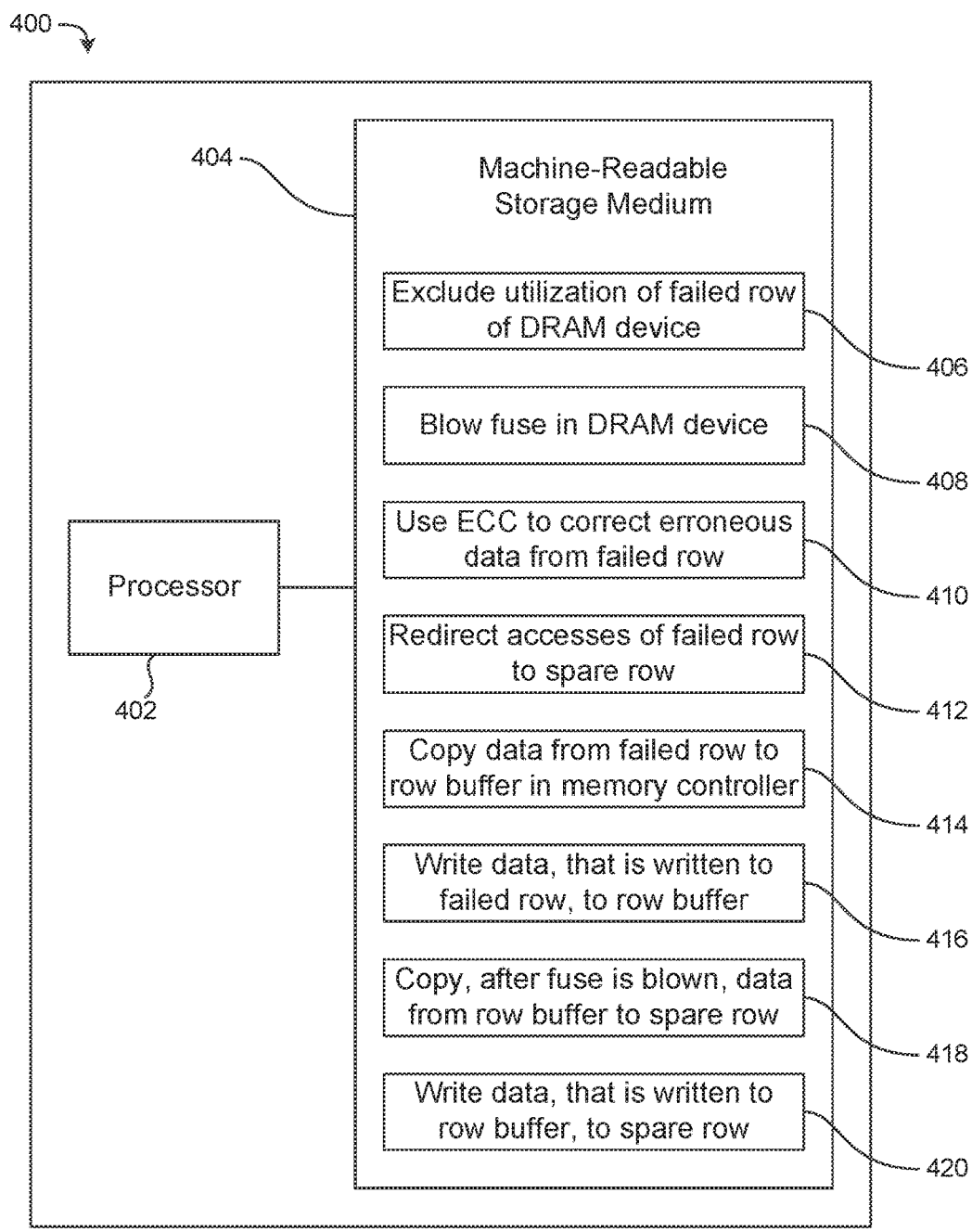
FIG. 4 is a block diagram of an example memory controller that includes a machine-readable storage medium encoded with instructions that enable use of a row buffer in a memory controller.

FIG. 4 is a block diagram of an example memory controller 400 that includes a machine-readable storage medium encoded with instructions that enable use of a row buffer in a memory controller. Memory controller 400 may be may be communicatively coupled to a memory module, such as a SIMM or DIMM. In FIG. 4, memory controller 400 includes processor 402 and machine-readable storage medium 404.

As with processor 102 of FIG. 1, processor 402 may include a CPU, microprocessor (e.g., semiconductor-based microprocessor), and/or other hardware device suitable for retrieval and/or execution of instructions stored in machine-readable storage medium 404. Processor 402 may fetch, decode, and/or execute instructions 406, 408, 410, 412, 414, 416, 418 and 420 to enable use of a row buffer in a memory controller, as described below. As an alternative or in addition to retrieving and/or executing instructions, processor 402 may include an electronic circuit comprising a number of electronic components for performing the functionality of instructions 406, 408, 410, 412, 414, 416, 418, and/or 420.

As with machine-readable storage medium 104 of FIG. 1, machine-readable storage medium 404 may be any suitable physical storage device that stores executable instructions. Instructions 406, 408, 410, and 412 on machine-readable storage medium 404 may be analogous to instructions 106, 108, 110, and 112 on machine-readable storage medium 104. Instructions 414 may copy data from a failed row of a DRAM device to a row buffer in memory controller 400. Accesses of parts of the failed row that have been copied to the row buffer may be temporarily redirected to the row buffer. Accesses of the failed row may be redirected to the row buffer before copying of data from the failed row to the row buffer is completed; while copying is in progress, accesses of parts of the failed row that have been copied may be redirected to the row buffer, and accesses of parts of the failed row that have not been copied may still occur. Copying of data from the failed row to the row buffer may be controlled by a BIOS. When the copying is complete, the BIOS may send memory controller 400 an indication not to access the failed row. The row buffer may be used instead of the failed row while a fuse in the DRAM device is being blown to replace the failed row with a spare row of the DRAM device.

Memory addresses that rely on bits in the failed row may be accessed to copy data from the failed row to the row buffer. Since memory controller 400 may access DRAM devices one cache line at a time, memory controller 400 may have to access multiple cache lines that rely on the failed row to ensure that all the data in the failed row is copied to the row buffer. In some implementations, a patrol scrubber may be used to access all addresses that rely on the failed row. In some implementations, a BIOS may manually read addresses during firmware interrupts (e.g., a few addresses may be read during each interrupt). In some implementations, an OS driver may read all of the addresses that rely on the failed row.

Instructions 416 may write data, that is written to the failed row, to the row buffer while data is copied from the failed row to the row buffer. Memory controller 400 may have to access multiple cache lines before all data is copied from the failed row to the row buffer, as discussed above, and an OS/application may write to the failed row before all such cache lines are accessed. Writing data, that is written to the failed row, to the row buffer while data is copied from the failed row to the row buffer may allow the row buffer to have an up-to-date copy of data in the failed row when all accesses of the failed row are temporarily redirected to the row buffer.

Instructions 418 may copy, after the fuse is blown; data from the row buffer to the spare row. Accesses of parts of the failed row that have been copied from the row buffer to the spare row may be redirected to the spare row. Accesses of the failed row may be redirected to the spare row before copying of data from the row buffer to the spare row is completed; while copying is in progress, accesses of parts of the failed row that have been copied from the row buffer to the spare row may be redirected to the spare row, and accesses of parts of the failed row that have not been copied from the row buffer to the spare row may be redirected to the row buffer. Copying of data from the row buffer to the spare row may be controlled by a BIOS. When the copying is complete; the BIOS may send memory controller 400 an indication not to use the row buffer.

Memory addresses that rely on bits in the failed row may be accessed to copy data from the row buffer to the spare row. Since memory controller 400 may access DRAM devices one cache line at a time, memory controller 400 may have to access multiple cache lines that rely on the failed row to ensure that all the data in the row buffer is copied to the spare row. In some implementations, a patrol scrubber may be used to access all addresses that rely on the failed row. In some implementations, a BIOS may manually read addresses during firmware interrupts (e.g., a few addresses may be read during each interrupt). In some implementations, an OS driver may read all of the addresses that rely on the failed row.

Instructions 420 may write data, that is written to the row buffer, to the spare row while data is copied from the row buffer to the spare row. Memory controller 400 may have to access multiple cache lines before all data is copied from the row buffer to the spare row, as discussed above, and an OS/application may attempt to write to the failed row (such an attempt may be redirected to the row buffer) before all such cache lines are accessed. Writing data, that is written to the row buffer, to the spare row while data is copied from the row buffer to the spare row may allow the spare row to have an up-to-date copy of data in the row buffer when all accesses of the failed row are redirected to the spare row.

Figure 5:
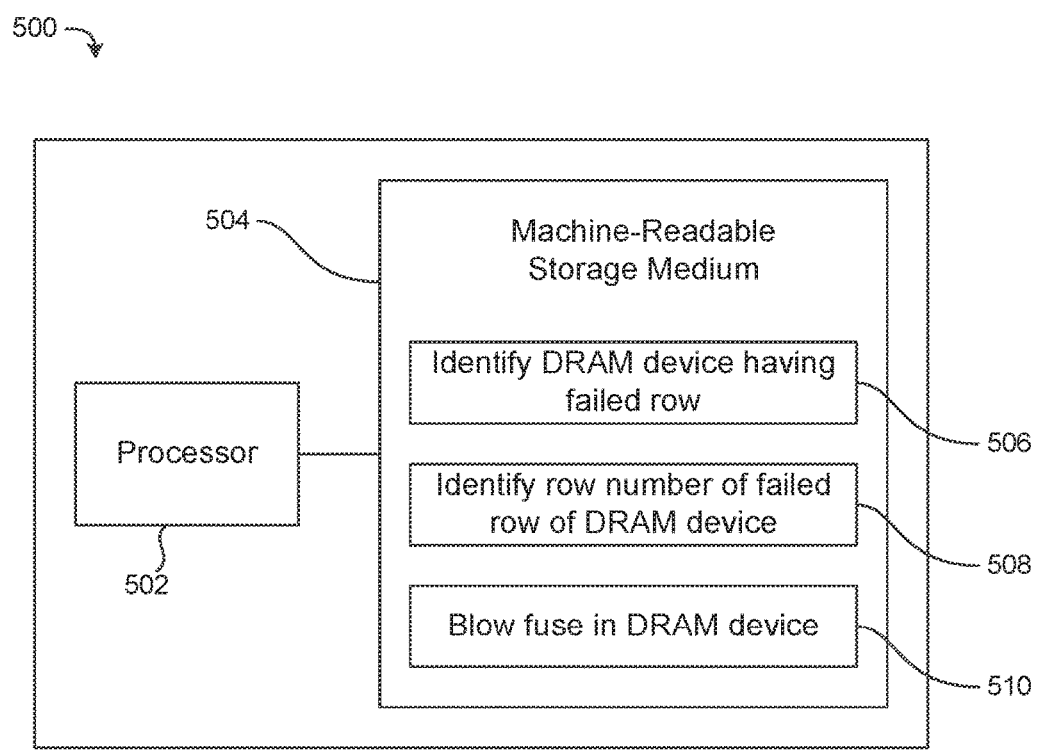
FIG. 5 is a block diagram of an example device that includes a machine-readable storage medium encoded with instructions to blow a fuse in a DRAM device during runtime operation of the DRAM device.

FIG. 5 is a block diagram of an example device 500 that includes a machine-readable storage medium encoded with instructions to blow a fuse in a DRAM device during runtime operation of the DRAM device. Device 500 may implement an entity (e.g., BIOS, state machine, management processor) that recognizes errors associated with, and enforces an error policy of (e.g., determines when to designate a row as, and/or when to replace, a failed row), a DRAM device. In FIG. 5, device 500 includes processor 502 and machine-readable storage medium 504.

As with processor 102 of FIG. 1, processor 502 may include a CPU, microprocessor (e.g., semiconductor-based microprocessor), and/or other hardware device suitable for retrieval and/or execution of instructions stored in machine-readable storage medium 504. Processor 502 may fetch, decode, and/or execute instructions 506, 508, and 510. As an alternative or in addition to retrieving and/or executing instructions, processor 502 may include an electronic circuit comprising a number of electronic components for performing the functionality of instructions 506, 508, and/or 510.

As with machine-readable storage medium 104 of FIG. 1, machine-readable storage medium 504 may be any suitable physical storage device that stores executable instructions. In some implementations, machine-readable storage medium 504 may include a non-transitory storage medium. As described in detail below, machine-readable storage medium 504 may be encoded with a set of executable instructions 506, 508, and 510.

Instructions 506 may identify a DRAM device having a failed row. For example, records may be kept of how many errors (e.g., read/write errors) are associated with the DRAM device and which addresses/locations in the DRAM device were accessed when the errors occurred. The DRAM device may be identified as having a failed row when the number of errors associated with a region of the DRAM device exceeds a threshold number of errors.

Instructions 508 may identify a row number of the failed row of the DRAM device. As used herein, the term "row number" refers to any suitable indicator for identifying a region of a DRAM device. In some implementations, the row number may be written to a register in a memory controller. The failed row may be excluded from utilization after being identified. For example, the DRAM device having the failed row may be temporarily replaced with a spare DRAM device, or the failed row may be temporarily replaced with a row buffer, or data read from the DRAM device may be ignored, as discussed above.

Instructions 510 may blow, during runtime operation of the DRAM device, a fuse in the DRAM device to replace the failed row with a spare row. In some implementations, a register in a memory controller may be written to cause the memory controller to send a command to the DRAM device to blow the fuse. While the fuse is being blown, ECC may be used to correct erroneous data from the failed row. For example, ECC may be used to correct erroneous data copied from the failed row to a spare DRAM device or to a row buffer, or ECC may be used to reconstruct data for a position in which the erroneous data appears in a cache line. After the fuse is blown, accesses of the failed row may be redirected to the spare row.

Figure 6:
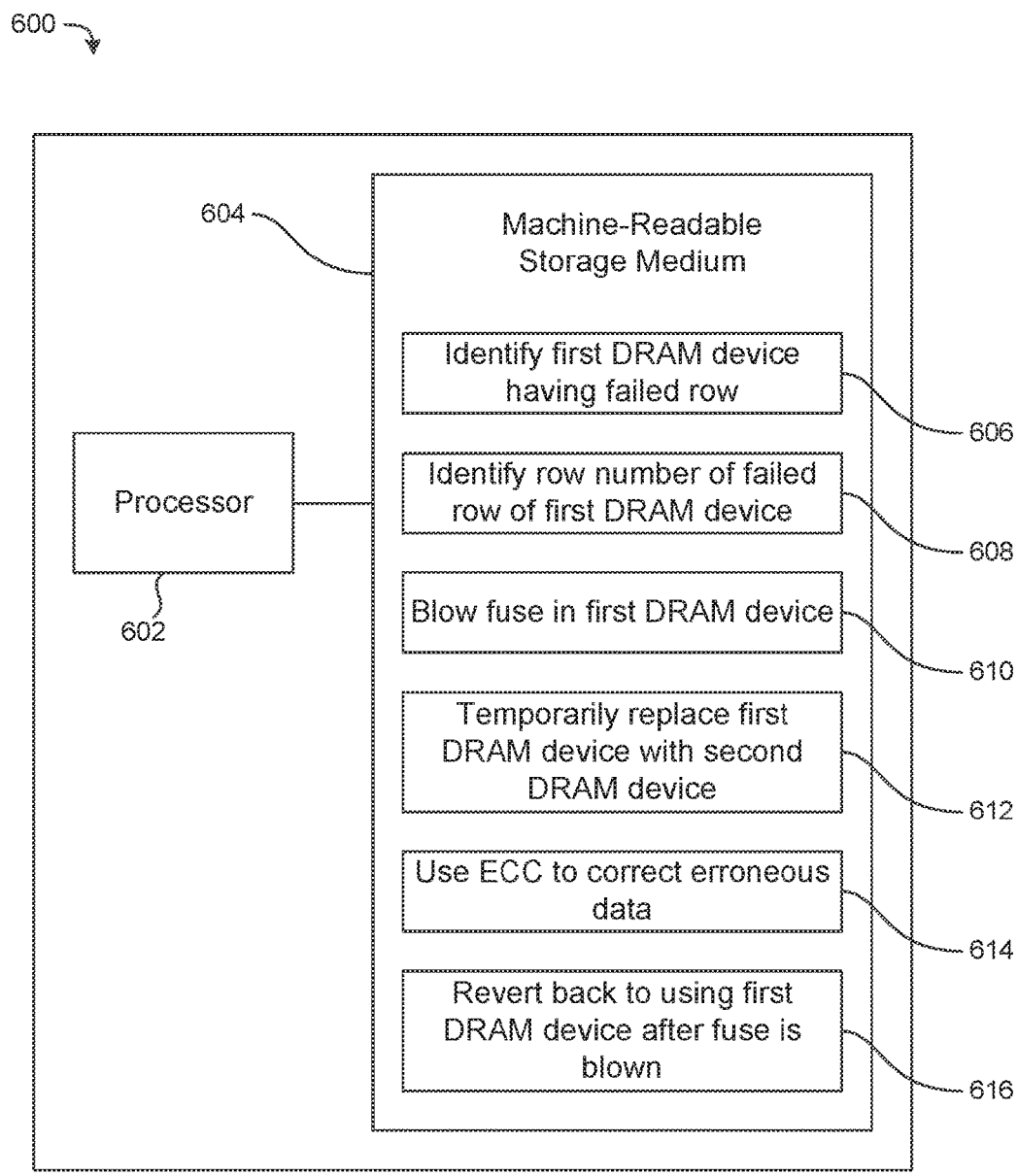
FIG. 6 is a block diagram of an example device that includes a machine-readable storage medium encoded with instructions to temporarily replace a first DRAM device with a second DRAM device.

FIG. 6 is a block diagram of an example device 600 that includes a machine-readable storage medium encoded with instructions to temporarily replace a first DRAM device with a second DRAM device. Device 600 may implement an entity (e.g., BIOS, state machine, management processor) that recognizes errors associated with, and enforces an error policy of (e.g., determines when to designate a row as, and/or when to replace, a failed row), a DRAM device. In FIG. 6, device 600 includes processor 602 and machine-readable storage medium 604.

As with processor 502 of FIG. 5, processor 602 may include a CPU, microprocessor (e.g., semiconductor-based microprocessor), and/or other hardware device suitable for retrieval and/or execution of instructions stored in machine-readable storage medium 604. Processor 602 may fetch, decode, and/or execute instructions 606, 608, 610, 612, 614, and 616. As an alternative or in addition to retrieving and/or executing instructions, processor 602 may include an electronic circuit comprising a number of electronic components for performing the functionality of instructions 606, 608, 610, 612, 614, and/or 616.

As with machine-readable storage medium 504 of FIG. 5, machine-readable storage medium 604 may be any suitable physical storage device that stores executable instructions. Instructions 606, 608, and 610 on machine-readable storage medium 604 may be analogous to instructions 506, 508, and 510 on machine-readable storage medium 504. Instructions 606 may identify a first DRAM device, of a plurality of DRAM devices, having a failed row. Instructions 612 may temporarily replace the first DRAM device with a second DRAM device of the plurality of DRAM devices. In some implementations, instructions 612 may invoke DCK, which may cause the first DRAM device to be replaced with the second (e.g., spare) DRAM device. Data may be copied from the first DRAM device to the second DRAM device before the first DRAM device is replaced. The second DRAM device may be used instead of the first DRAM device while a fuse in the first DRAM device is being blown to replace the failed row with a spare row of the first DRAM device.

Instructions 614 may use ECC to correct erroneous data copied from the failed row of the first DRAM device to the second DRAM device. Thus, the second DRAM device may store accurate rather than erroneous data. In some implementations, ECC may be used to recreate missing data in the second DRAM device.

Instructions 616 may revert back to using the first DRAM device after the fuse is blown. In some implementations, instructions 616 may be executed without a system reboot (e.g., if a BIOS is able to reverse DCK chip-sparing during runtime). In some implementations, instructions 616 may be executed on reboot, and the first DRAM device with the mapped-in spare row may be initialized for use before an OS is loaded.

Figure 7:
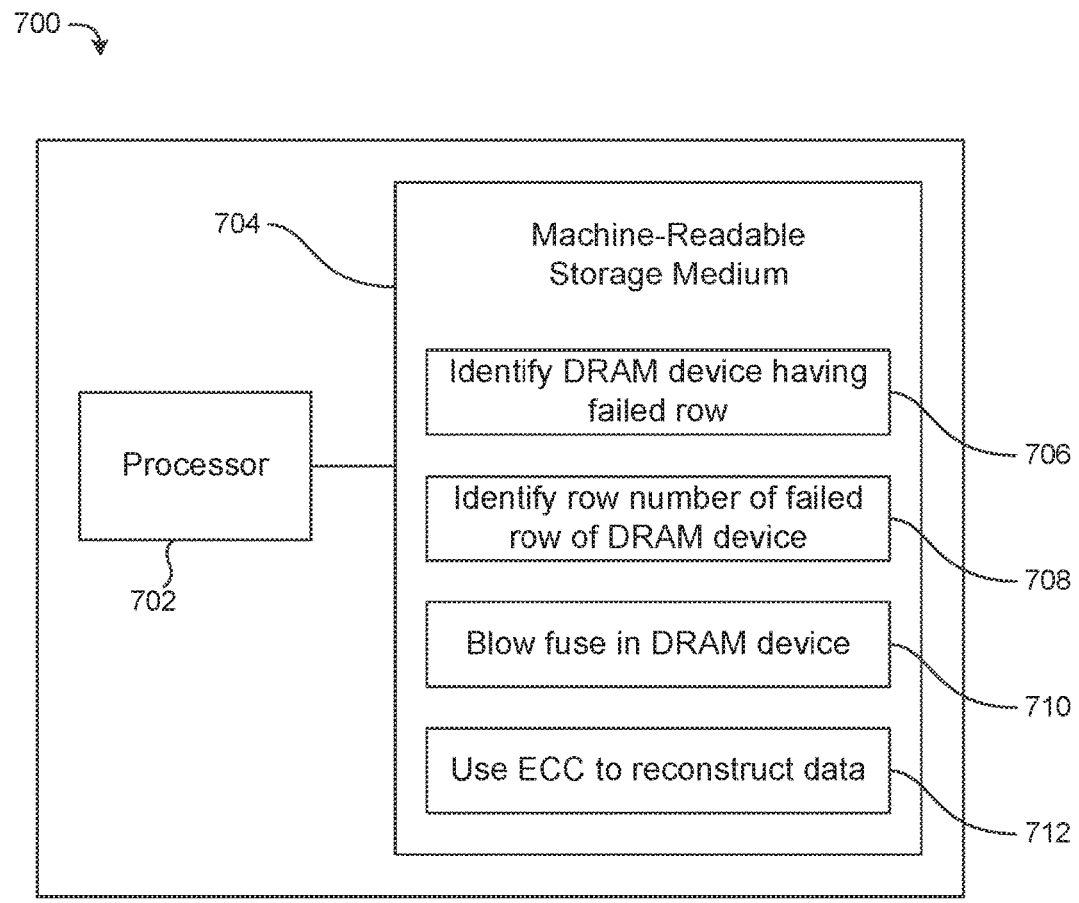
FIG. 7 is a block diagram of an example device that includes a machine-readable storage medium encoded with instructions to use error-correcting code to reconstruct data.

FIG. 7 is a block diagram of an example device 700 that includes a machine-readable storage medium encoded with instructions to use ECC to reconstruct data. Device 700 may implement an entity (e.g., BIOS, state machine, management processor) that recognizes errors associated with, and enforces an error policy of (e.g., determines when to designate a row as, and/or when to replace, a failed row), a DRAM device. In FIG. 7, device 700 includes processor 702 and machine-readable storage medium 704.

As with processor 502 of FIG. 5, processor 702 may include a CPU, microprocessor (e.g., semiconductor-based microprocessor), and/or other hardware device suitable for retrieval and/or execution of instructions stored in machine-readable storage medium 704. Processor 702 may fetch, decode, and/or execute instructions 706, 708, 710, and 712. As an alternative or in addition to retrieving and/or executing instructions, processor 702 may include an electronic circuit comprising a number of electronic components for performing the functionality of instructions 706, 708, 710, and/or 712.

As with machine-readable storage medium 504 of FIG. 5, machine-readable storage medium 704 may be any suitable physical storage device that stores executable instructions. Instructions 706, 708, and 710 on machine-readable storage medium 704 may be analogous to instructions 506, 508, and 510 on machine-readable storage medium 504. Instructions 706 may identify a DRAM device having a failed row. Erroneous data that is read from the DRAM device (e.g., from the failed row) may appear in a position in a cache line. Instructions 712 may use ECC to reconstruct data, for the position in which the erroneous data appears in the cache line, using data from other positions in the cache line. Instructions 712 may be executed while a fuse in the DRAM device is blown to replace the failed row with a spare row, during which time behavior of the DRAM device may be indeterminate. Execution of instructions 712 may allow data read from the DRAM device to be ignored, and may allow a fuse in the DRAM device to be blown during runtime even if the DRAM device/failed row is not temporarily replaced (e.g., with a spare DRAM device or row buffer) while the fuse is blown.

Figure 8:
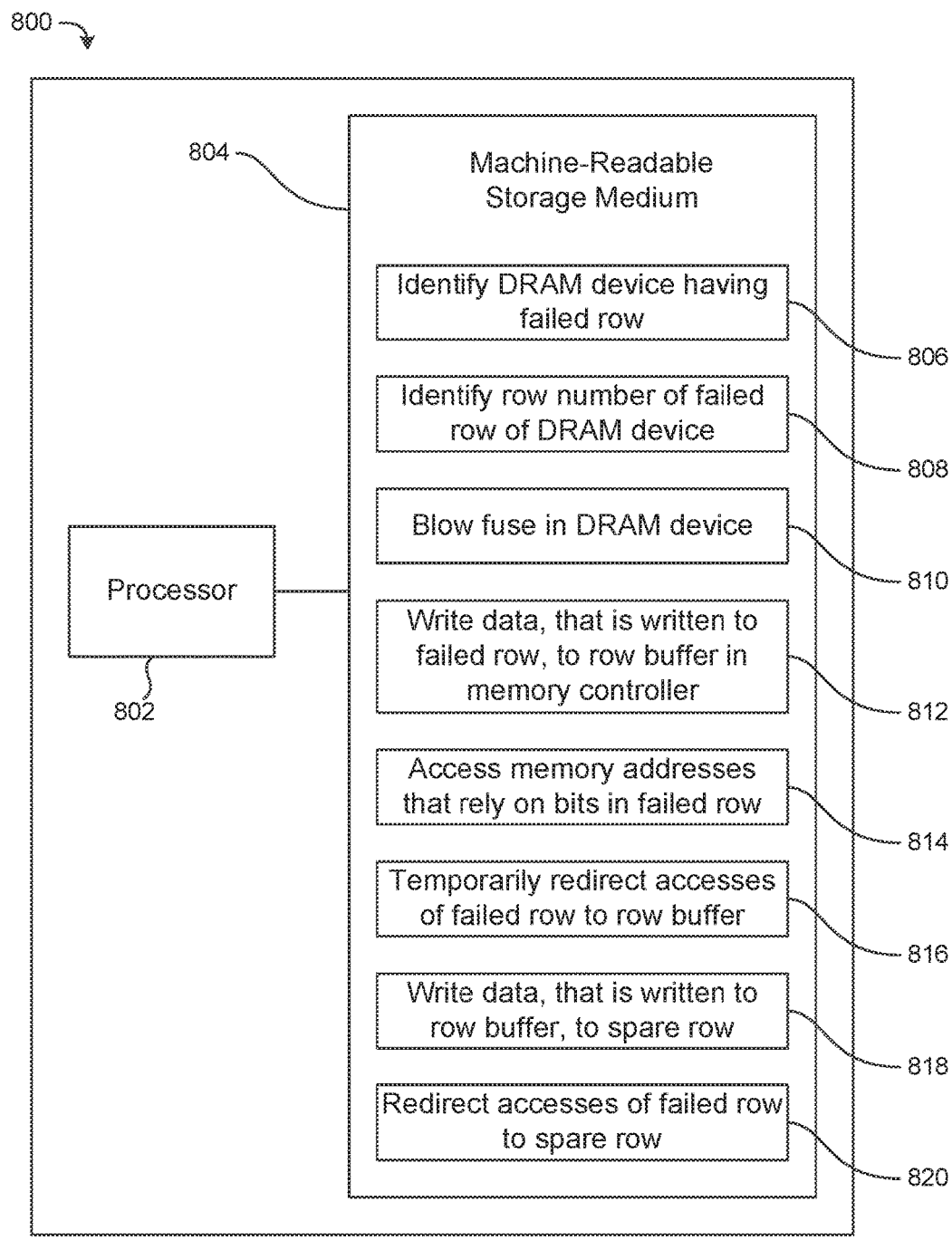
FIG. 8 is a block diagram of an example device that includes a machine-readable storage medium encoded with instructions that enable temporary use of a row buffer in a memory controller.

FIG. 8 is a block diagram of an example device 800 that includes a machine-readable storage medium encoded with instructions that enable temporary use of a row buffer in a memory controller. Device 800 may implement an entity (e.g., BIOS, state machine, management processor) that recognizes errors associated with, and enforces an error policy of (e.g., determines when to designate a row as, and/or when to replace, a failed row), a DRAM device. In FIG. 8, device 800 includes processor 802 and machine-readable storage medium 804.

As with processor 502 of FIG. 5, processor 802 may include a CPU, microprocessor (e.g., semiconductor-based microprocessor), and/or other hardware device suitable for retrieval and/or execution of instructions stored in machine-readable storage medium 804. Processor 802 may fetch, decode, and/or execute instructions 806, 808, 810, 812, 814, 816, 818, and 820 to enable temporary use of a row buffer in a memory controller, as described below. As an alternative or in addition to retrieving and/or executing instructions, processor 802 may include an electronic circuit comprising a number of electronic components for performing the functionality of instructions 806, 808, 810, 812, 814, 816, 818, and/or 820.

As with machine-readable storage medium 504 of FIG. 5, machine-readable storage medium 804 may be any suitable physical storage device that stores executable instructions. Instructions 806, 808, and 810 on machine-readable storage medium 804 may be analogous to instructions 506, 508, and 510 on machine-readable storage medium 504. Instructions 806 may identify a DRAM device having a failed row. Instructions 812 may write data, that is written to the failed row, to a row buffer in a memory controller. Data may be copied from the failed row to the row buffer. In some implementations, a register in the memory controller may be written to cause data, that is written to the failed row, to be written to the row buffer while data is copied from the failed row to the row buffer. The memory controller may have to access multiple cache lines before all data is copied from the failed row to the row buffer, as discussed above, and an OS/application may write to the failed row before all such cache lines are accessed. Writing data, that is written to the failed row, to the row buffer while data is copied from the failed row to the row buffer may allow the row buffer to have an up-to-date copy of data in the failed row when all accesses of the failed row are temporarily redirected to the row buffer.

Instructions 814 may access memory addresses that rely on bits in the failed row. Instructions 814 may be executed to copy data from the failed row to the row buffer, and to copy data from the row buffer to a spare row that is mapped in for the failed row as a result of blowing a fuse. In some implementations, execution of instructions 814 may cause a patrol scrubber to be used to access all addresses that rely on the failed row. In some implementations, a BIOS may manually read addresses during firmware interrupts (e.g., a few addresses may be read during each interrupt). In some implementations, execution of instructions 814 may cause an OS driver to read all of the memory addresses that rely upon the failing row.

Instructions 816 may temporarily redirect, to the row buffer, accesses of parts of the failed row that have been copied to the row buffer. Accesses of the failed row may be redirected to the row buffer before copying of data from the failed row to the row buffer is completed; while copying is in progress, accesses of parts of the failed row that have been copied may be redirected to the row buffer, and accesses of parts of the failed row that have not been copied may still occur. The row buffer may be used instead of the failed row while a fuse in the DRAM device is being blown to replace the failed row with a spare row of the DRAM device.

Instructions 818 may write data, that is written to the row buffer, to the spare row. Data may be copied from the row buffer to the spare row after the fuse is blown. In some implementations, a register in the memory controller may be written to cause data, that is written to the row buffer, to be written to the spare row while data is copied from the row buffer to the spare row. The memory controller may have to access multiple cache lines before all data is copied from the row buffer to the spare row, as discussed above, and an OS/application may attempt to write to the failed row (such an attempt may be redirected to the row buffer) before all such cache lines are accessed. Writing data, that is written to the row buffer, to the spare row while data is copied from the row buffer to the spare row may allow the spare row to have an up-to-date copy of data in the row buffer when all accesses of the failed row are redirected to the spare row.

Instructions 820 may redirect, to the spare row, accesses of parts of the failed row that have been copied from the row buffer to the spare row. Accesses of the failed row may be redirected to the spare row before copying of data from the row buffer to the spare row is completed; while copying is in progress, accesses of parts of the failed row that have been copied from the row buffer to the spare row may be redirected to the spare row, and accesses of parts of the failed row that have not been copied from the row buffer to the spare row may be redirected to the row buffer. Once copying from the row buffer to the spare row is completed, the row buffer may no longer be used.

Figure 9:
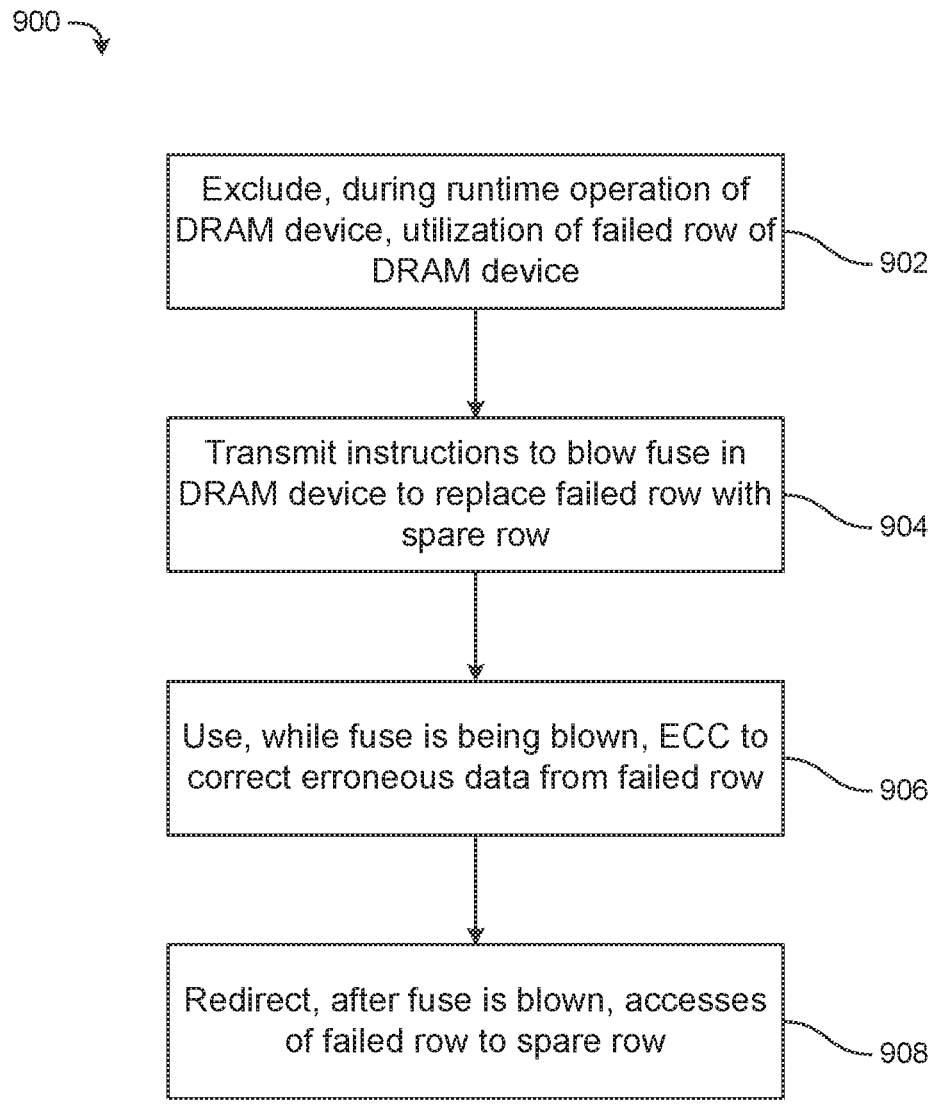
FIG. 9 is a flowchart of an example method for DRAM row sparing.

Methods related to replacing a failed row of a DRAM device are discussed with respect to FIGS. 9-15. FIG. 9 is a flowchart of an example method 900 for DRAM row sparing. Although execution of method 900 is described below with reference to processor 102 of FIG. 1, it should be understood that execution of method 900 may be performed by other suitable devices, such as processors 202, 302, and 402 of FIGS. 2, 3, and 4, respectively. Method 900 may be implemented in the form of executable instructions stored on a machine-readable storage medium and/or in the form of electronic circuitry.

Method 900 may start in block 902, where processor 102 may exclude, during runtime operation of a DRAM device, utilization of a failed row of the DRAM device. In some implementations, utilization of the failed row may be excluded by temporarily replacing the DRAM with a spare DRAM, or by temporarily replacing the failed row with a row buffer, as discussed above. In some implementations, utilization of the failed row may be excluded by ignoring erroneous data that is read from the failed row and that appears in a position in a cache line.

In block 904, processor 102 may transmit instructions to blow a fuse in the DRAM device to replace the failed row with a spare row. The fuse may be blown during runtime operation of the DRAM device. Although block 904 is shown below block 902 in FIG. 9, it should be understood that instructions to blow the fuse may be transmitted before or in parallel with excluding utilization of the failed row. The blowing of the fuse may occur after utilization of the failed row is excluded.

Next, in block 906, processor 102 may use, while the fuse is being blown, ECC to correct erroneous data from the failed row. In some implementations, ECC may be used to correct erroneous data copied from the failed row to a spare DRAM device or to a row buffer, such that the spare DRAM device/row buffer stores accurate rather than erroneous data. In some implementations, erroneous data that is read from the failed row, and that appears in a position in a cache line, may be ignored, and ECC may be used to reconstruct, using data from other positions in the cache line, error-free data for the position in which the erroneous data appears in the cache line.

Finally, in block 908, processor 102 may redirect, after the fuse is blown, accesses of the failed row to the spare row. Addresses/locations in the failed row may be mapped to corresponding addresses/locations in the spare row. After the fuse is blown, when a memory controller (e.g., memory controller 100) receives read commands directed at addresses/locations in the failed row, the corresponding addresses/locations in the spare row may be read instead of those in the failed row. Similarly, in response to write commands directed at addresses/locations in the failed row, the memory controller may instead write to the corresponding addresses/locations in the spare row.

Figure 10:
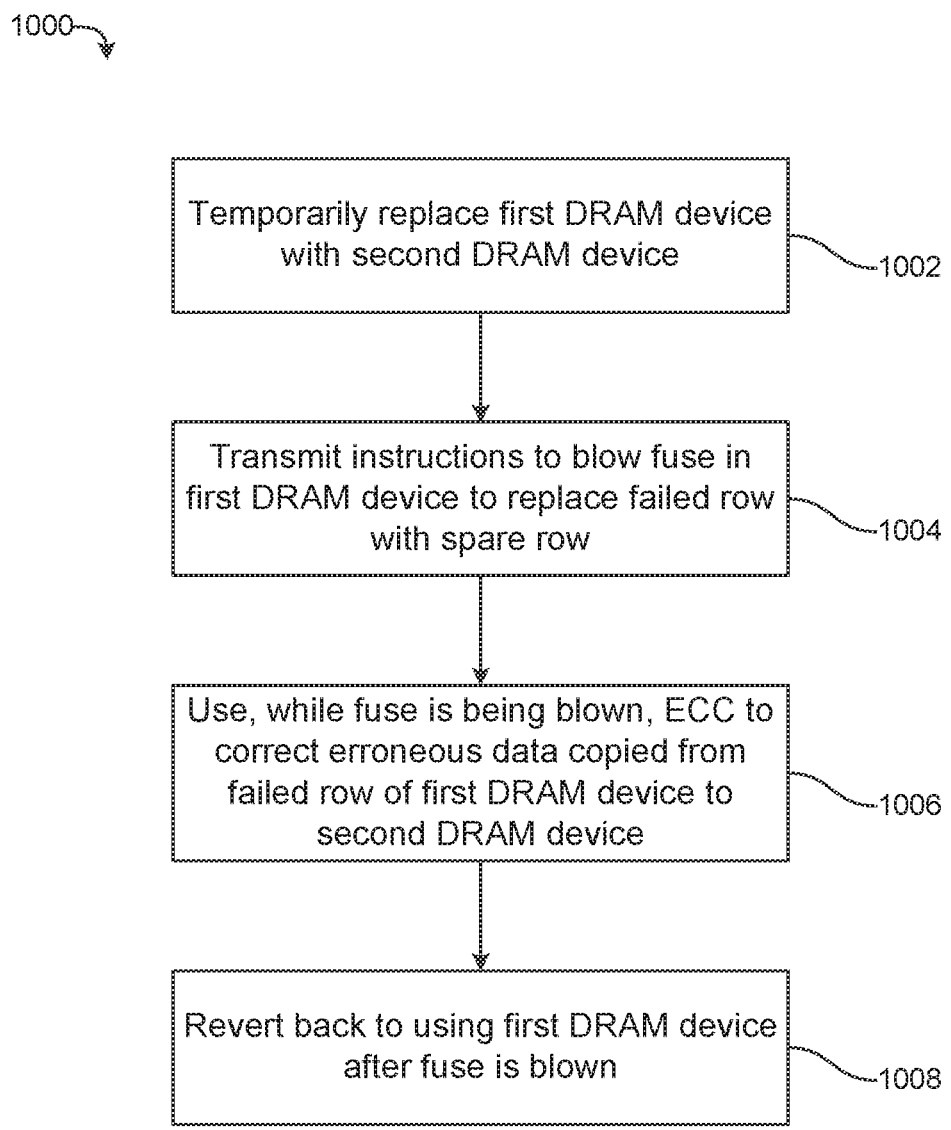
FIG. 10 is a flowchart of an example method for DRAM sparing while a fuse is being blown on a DRAM device.

FIG. 10 is a flowchart of an example method 1000 for DRAM sparing while a fuse is being blown on a DRAM device. Although execution of method 1000 is described below with reference to processor 202 of FIG. 2, it should be understood that execution of method 1000 may be performed by other suitable devices, such as processor 102 of FIG. 1. Some blocks of method 1000 may be performed in parallel with and/or after method 900. Method 1000 may be implemented in the form of executable instructions stored on a machine-readable storage medium and/or in the form of electronic circuitry.

Method 1000 may start in block 1002, where processor 202 may temporarily replace a first DRAM device, of a plurality of DRAM devices, with a second DRAM device of the plurality of DRAM devices. In some implementations, a BIOS may invoke DCK after a failed row is identified in the first DRAM device, causing the first DRAM device to be replaced with a second (e.g., spare) DRAM device. Data may be copied from the first DRAM device to the second DRAM device before the first DRAM device is replaced.

In block 1004, processor 202 may transmit instructions to blow a fuse in the first DRAM device to replace the failed row with a spare row. The fuse may be blown during runtime operation of the first DRAM device. Although block 1004 is shown below block 1002 in FIG. 10, it should be understood that instructions to blow the fuse may be transmitted before or in parallel with replacing the first DRAM device with the second DRAM device. The blowing of the fuse may occur after the first DRAM device has been replaced with the second DRAM device. The second DRAM device may be used instead of the first DRAM device while the fuse is being blown.

Next, in block 1006, processor 202 may use, while the fuse is being blown, ECC to correct erroneous data copied from the failed row of the first DRAM device to the second DRAM device. Thus, the second DRAM device may store accurate rather than erroneous data. In some implementations, ECC may be used to recreate missing data in the second DRAM device.

Finally, in block 1008, processor 202 may revert back to using the first DRAM device after the fuse is blown. ECC may be used to correct/recreate erroneous and/or missing data in the spare row that was mapped in by blowing the fuse. In some implementations, processor 202 may revert back to using the first DRAM device without a system reboot. For example, a BIOS may be able to reverse DCK chip-sparing during runtime. In some implementations, reverting back to using the first DRAM device may occur during a system reboot. For example, DCK may no longer apply on reboot, and the first DRAM device with the mapped-in spare row may be initialized for use before an OS is loaded.

Figure 11:
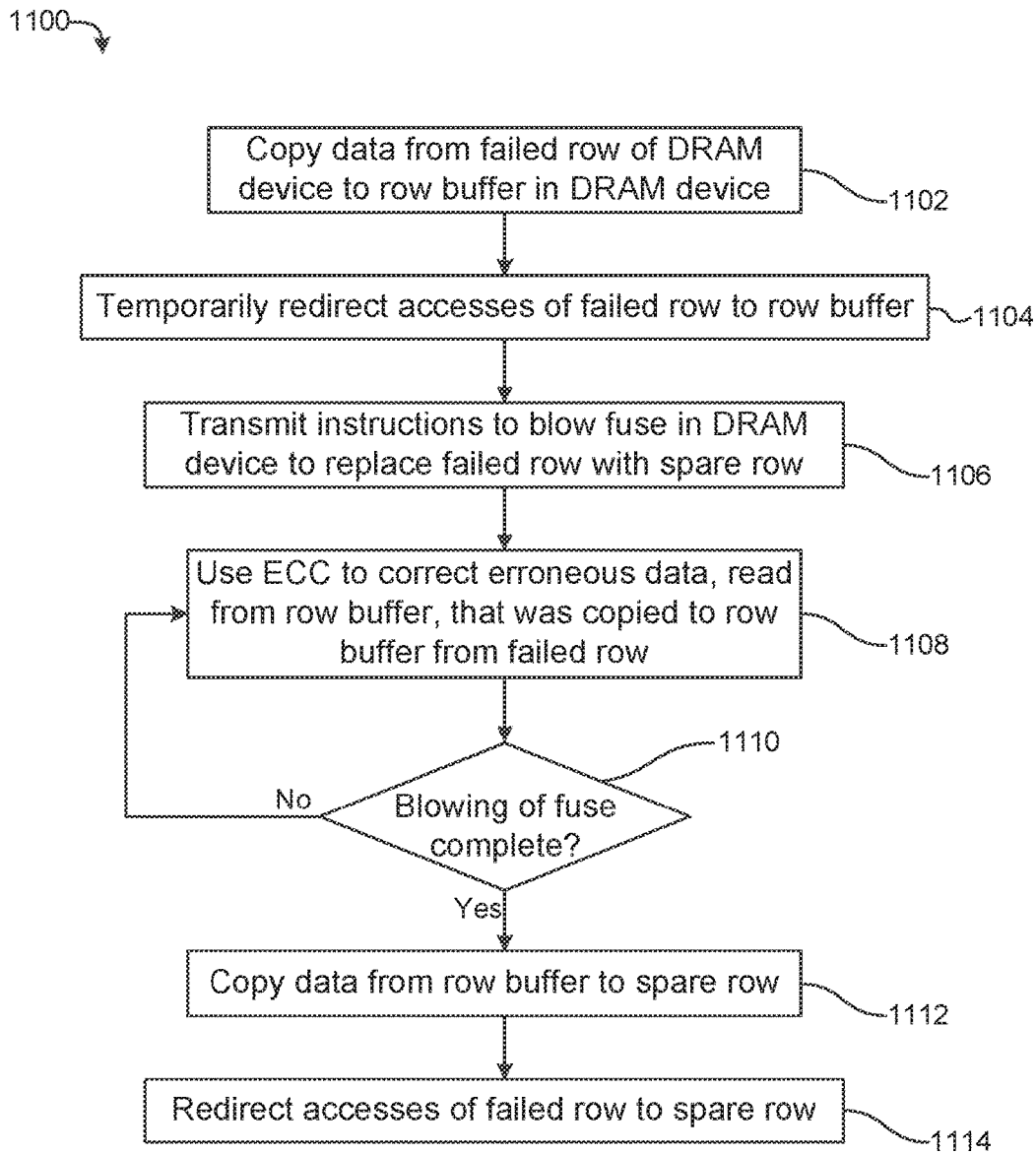
FIG. 11 is a flowchart of an example method for using a row buffer in a DRAM device.

FIG. 11 is a flowchart of an example method 1100 for using a row buffer in a DRAM device. Although execution of method 1100 is described below with reference to processor 302 of FIG. 3, it should be understood that execution of method 1100 may be performed by other suitable devices, such as processor 102 of FIG. 1. Some blocks of method 1100 may be performed in parallel with and/or after method 900. Method 1100 may be implemented in the form of executable instructions stored on a machine-readable storage medium and/or in the form of electronic circuitry.

Method 1100 may start in block 1102, where processor 302 may copy data from a failed row of a DRAM device to a row buffer in the DRAM device. In block 1104, processor 302 may temporarily redirect, to the row buffer, accesses of parts of the failed row that have been copied to the row buffer. Although block 1104 is shown below block 1102 in FIG. 11, it should be understood that accesses of the failed row may be redirected to the row buffer before copying of data from the failed row to the row buffer is completed; while copying is in progress, accesses of parts of the failed row that have been copied may be redirected to the row buffer, and accesses of parts of the failed row that have not been copied may still occur. The row buffer may be used instead of the failed row while a fuse in the DRAM device is being blown to replace the failed row with a spare row of the DRAM device.

In block 1106, processor 302 may transmit instructions to blow a fuse in the DRAM device to replace the failed row with a spare row. The fuse may be blown during runtime operation of the DRAM device. Although block 1106 is shown below blocks 1102 and 1104 in FIG. 11, it should be understood that elements of block 1106 may be performed before or in parallel with elements of blocks 1102 and/or 1104. The blowing of the fuse may occur after copying of data from the failed row to the row buffer is completed.

In block 1108, processor 302 may use ECC to correct erroneous data, read from the row buffer, that was copied to the row buffer from the failed row. Thus, the row buffer may store accurate rather than erroneous data. In some implementations, ECC may be used to recreate missing data in the row buffer.

In block 1110, processor 302 may determine whether the blowing of the fuse is complete. If processor 302 determines that the blowing of the fuse is not complete, method 1100 may loop back to block 1108. Processor 302 may continue using the row buffer instead of the failed row while the fuse is being blown. If, in block 1110, processor 302 determines that the blowing of the fuse is complete, method 1100 may proceed to block 1112, in which processor 302 may copy data from the row buffer to the spare row.

In block 1114, processor 302 may redirect, to the spare row, accesses of parts of the failed row that have been copied from the row buffer to the spare row. Although block 1114 is shown below block 1112 in FIG. 11, it should be understood that accesses of the failed row may be redirected to the spare row before copying of data from the row buffer to the spare row is completed; while copying is in progress, accesses of parts of the failed row that have been copied from the row buffer to the spare row may be redirected to the spare row, and accesses of parts of the failed row that have not been copied from the row buffer to the spare row may be redirected to the row buffer. After copying of data from the row buffer to the spare row is completed, processor 302 may no longer use the row buffer.

Figure 12:
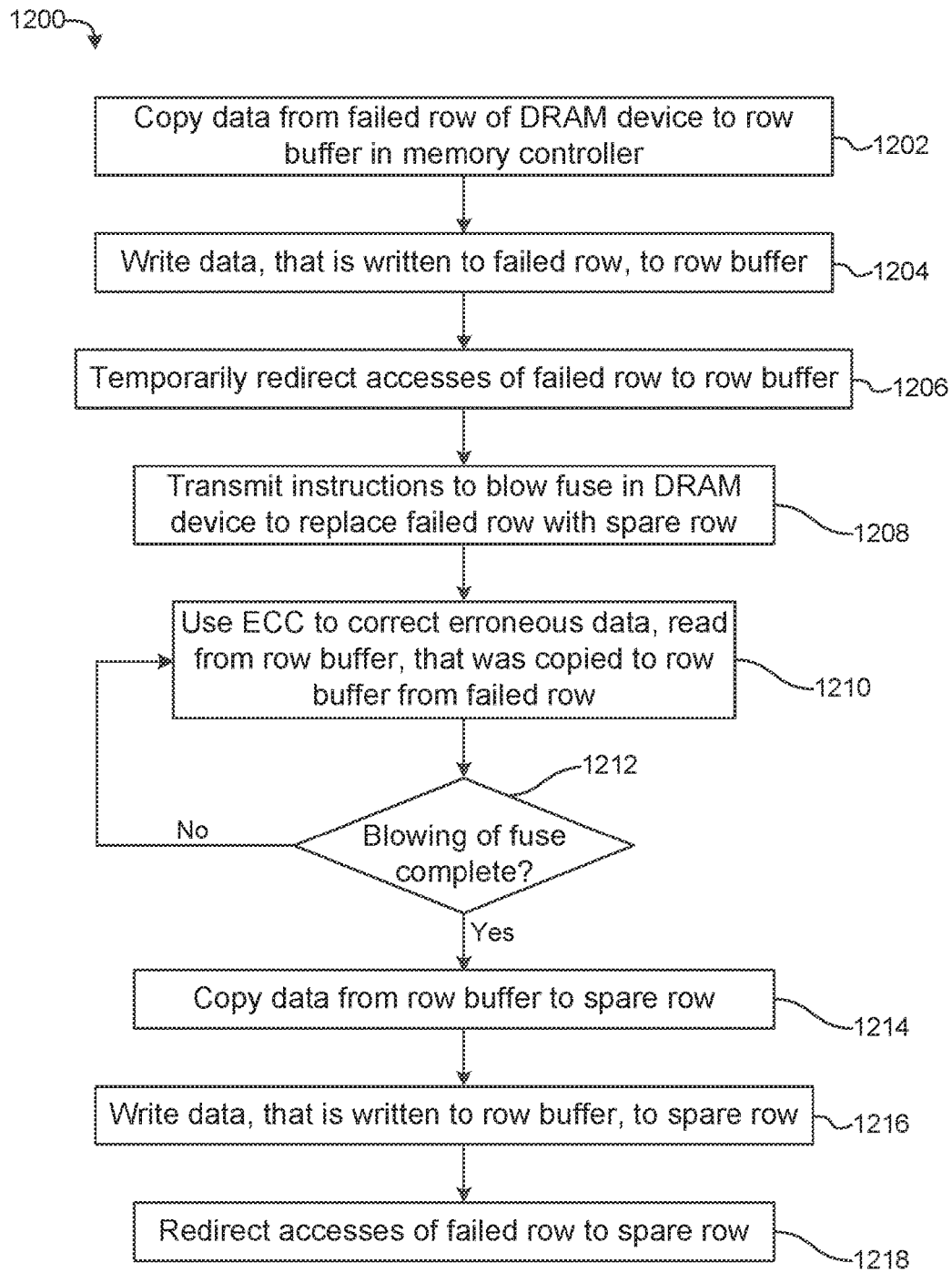
FIG. 12 is a flowchart of an example method for using a row buffer in a memory controller.

FIG. 12 is a flowchart of an example method 1200 for using a row buffer in a memory controller. Although execution of method 1200 is described below with reference to processor 402 of FIG. 4, it should be understood that execution of method 1200 may be performed by other suitable devices, such as processor 102 of FIG. 1. Some blocks of method 1200 may be performed in parallel with and/or after method 900. Method 1200 may be implemented in the form of executable instructions stored on a machine-readable storage medium and/or in the form of electronic circuitry.

Method 1200 may start in block 1202, where processor 402 may copy data from a failed row of a DRAM device to a row buffer in a memory controller. Memory addresses that rely on bits in the failed row may be accessed to copy data from the failed row to the row buffer. Since the memory controller (e.g., memory controller 400) may access DRAM devices one cache line at a time, the memory controller may have to access multiple cache lines that rely on the failed row to ensure that all the data in the failed row is copied to the row buffer. In some implementations, a patrol scrubber may be used to access all addresses that rely on the failed row. In some implementations, a BIOS may manually read addresses during firmware interrupts (e.g., a few addresses may be read during each interrupt). In some implementations, an OS driver may read all of the addresses that rely on the failed row.

In block 1204, processor 402 may write data, that is written to the failed row, to the row buffer. Although block 1204 is shown below block 1202 in FIG. 12, it should be understood that data, that is written to the failed row, may be written to the row buffer while data is copied from the failed row to the row buffer. A memory controller (e.g., memory controller 400) may have to access multiple cache lines before all data is copied from the failed row to the row buffer, as discussed above, and an OS/application may write to the failed row before all such cache lines are accessed. Writing data, that is written to the failed row, to the row buffer while data is copied from the failed row to the row buffer may allow the row buffer to have an up-to-date copy of data in the failed row when all accesses of the failed row are temporarily redirected to the row buffer.

In block 1206, processor 402 may temporarily redirect, to the row buffer, accesses of parts of the failed row that have been copied to the row buffer. Although block 1206 is shown below blocks 1202 and 1204 in FIG. 12, it should be understood that accesses of the failed row may be redirected to the row buffer before copying of data from the failed row to the row buffer is completed; while copying is in progress, accesses of parts of the failed row that have been copied may be redirected to the row buffer, and accesses of parts of the failed row that have not been copied may still occur. Copying of data from the failed row to the row buffer may be controlled by a BIOS. When the copying is complete, the BIOS may send the memory controller an indication not to access the failed row. The row buffer may be used instead of the failed row while a fuse in the DRAM device is being blown to replace the failed row with a spare row of the DRAM device.

In block 1208, processor 402 may transmit instructions to blow a fuse in the DRAM device to replace the failed row with a spare row. The fuse may be blown during runtime operation of the DRAM device. Although block 1208 is shown below blocks 1202, 1204, and 1206 in FIG. 12, it should be understood that elements of block 1208 may be performed before or in parallel with elements of blocks 1202, 1204, and/or 1206. The blowing of the fuse may occur after copying of data from the failed row to the row buffer is completed.

In block 1210, processor 402 may use ECC to correct erroneous data, read from the row buffer, that was copied to the row buffer from the failed row. Thus, the row buffer may store accurate rather than erroneous data. In some implementations, ECC may be used to recreate missing data in the row buffer.

In block 1212, processor 402 may determine whether the blowing of the fuse is complete. If processor 402 determines that the blowing of the fuse is not complete, method 1200 may loop back to block 1210. Processor 402 may continue using the row buffer instead of the failed row while the fuse is being blown.

If, in block 1212, processor 402 determines that the blowing of the fuse is complete, method 1200 may proceed to block 1214, in which processor 402 may copy data from the row buffer to the spare row. Memory addresses that rely on bits in the failed row may be accessed to copy data from the row buffer to the spare row. Since the memory controller may access DRAM devices one cache line at a time, the memory controller may have to access multiple cache lines that rely on the failed row to ensure that all the data in the row buffer is copied to the spare row. In some implementations, a patrol scrubber may be used to access all addresses that rely on the failed row. In some implementations, a BIOS may manually read addresses during firmware interrupts (e.g., a few addresses may be read during each interrupt). In some implementations, an OS driver may read all of the addresses that rely on the failed row.

In block 1216, processor 402 may write data, that is written to the row buffer, to the spare row while data is copied from the row buffer to the spare row. Although block 1216 is shown below block 1214 in FIG. 12, it should be understood that data, that is written to the row buffer, may be written to the spare row while data is copied from the row buffer to the spare row. The memory controller may have to access multiple cache lines before all data is copied from the row buffer to the spare row, as discussed above, and an OS/application may attempt to write to the failed row (such an attempt may be redirected to the row buffer) before all such cache lines are accessed. Writing data, that is written to the row buffer, to the spare row while data is copied from the row buffer to the spare row may allow the spare row to have an up-to-date copy of data in the row buffer when all accesses of the failed row are redirected to the spare row.

In block 1218, processor 402 may redirect, to the spare row, accesses of parts of the failed row that have been copied from the row buffer to the spare row. Although block 1218 is shown below blocks 1214 and 1216 in FIG. 12, it should be understood that accesses of the failed row may be redirected to the spare row before copying of data from the row buffer to the spare row is completed; while copying is in progress, accesses of parts of the failed row that have been copied from the row buffer to the spare row may be redirected to the spare row, and accesses of parts of the failed row that have not been copied from the row buffer to the spare row may be redirected to the row buffer. Copying of data from the row buffer to the spare row may be controlled by a BIOS. When the copying is complete, the BIOS may send the memory controller an indication not to use the row buffer.

Figure 13:
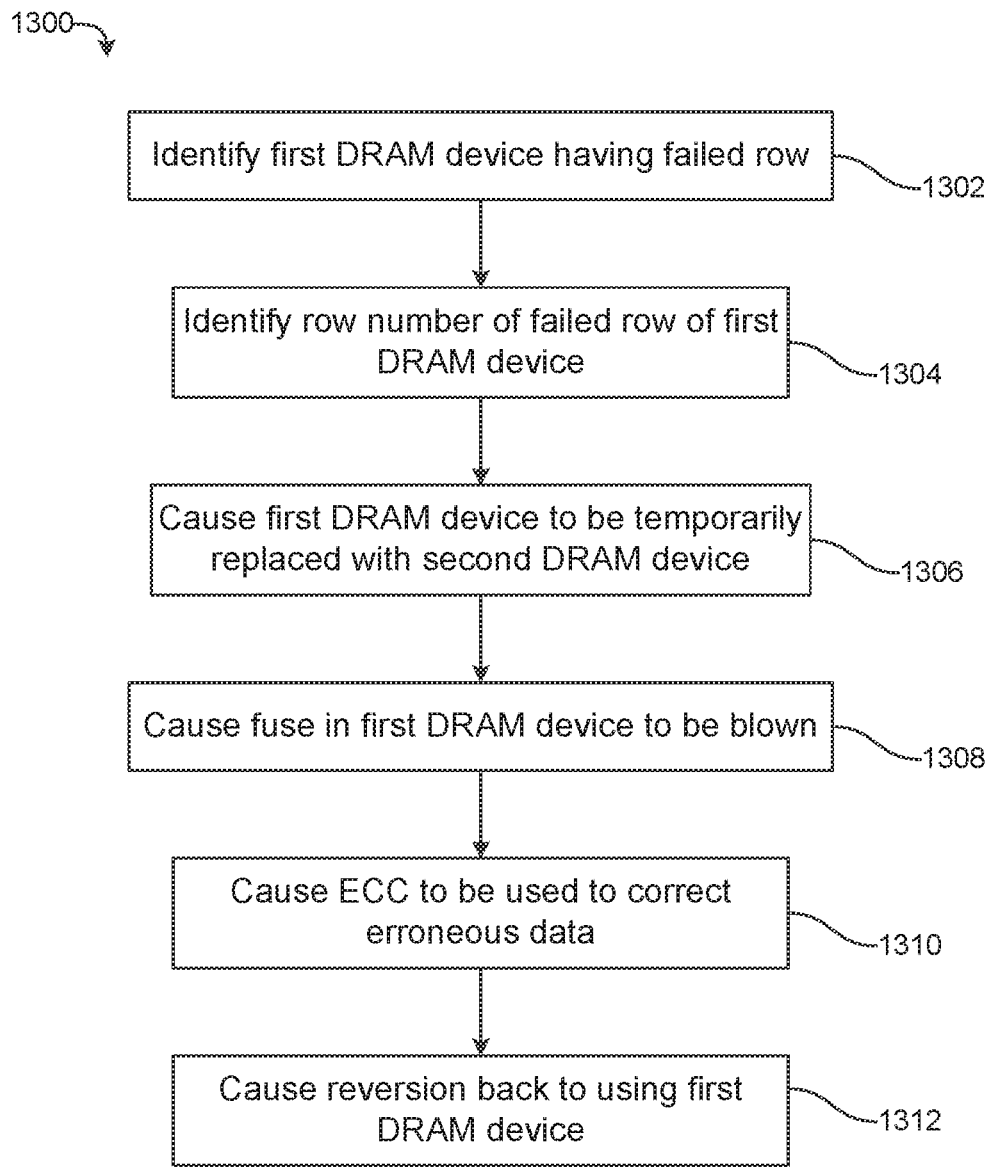
FIG. 13 is a flowchart of an example method for replacing a failed row on a DRAM device.

FIG. 13 is a flowchart of an example method 1300 for replacing a failed row on a DRAM device. Although execution of method 1300 is described below with reference to processor 602 of FIG. 6, it should be understood that execution of method 1300 may be performed by other suitable devices, such as processor 502 of FIG. 5. Method 1300 may be implemented in the form of executable instructions stored on a machine-readable storage medium and/or in the form of electronic circuitry.

Method 1300 may start in block 1302, where processor 602 may identify a first DRAM device, of a plurality of DRAM devices, having a failed row. For example, records may be kept of how many errors (e.g., read/write errors) are associated with the first DRAM device and which addresses/locations in the first DRAM device were accessed when the errors occurred. The first DRAM device may be identified as having a failed row when the number of errors associated with a region of the first DRAM device exceeds a threshold number of errors.

In block 1304, processor 602 may identify a row number of the failed row of the first DRAM device. In some implementations, processor 602 may write the row number to a register in a memory controller. Although block 1304 is shown below block 1302 in FIG. 13, it should be understood that elements of blocks 1302 and 1304 may be performed in parallel.

Next, in block 1306, processor 602 may cause the first DRAM device to be temporarily replaced with a second DRAM device of the plurality of DRAM devices. For example, processor 602 may invoke DCK, which may cause the first DRAM device to be replaced with the second (e.g., spare) DRAM device. Data may be copied from the first DRAM device to the second DRAM device before the first DRAM device is replaced. The second DRAM device may be used instead of the first DRAM device while a fuse in the first DRAM device is being blown to replace the failed row with a spare row of the first DRAM device.

In block 1308, processor 602 may cause a fuse in the first DRAM device to be blown. In some implementations, processor 602 may write a register in a memory controller to cause the memory controller to send a command to the first DRAM device to blow the fuse. The fuse may be blown during runtime operation of the first DRAM device.

In block 1310, processor 602 may cause, while the fuse is being blown, ECC to be used to correct erroneous data from the failed row. For example, ECC may be used to correct erroneous data copied from the failed row of the first DRAM device to the second DRAM device. Thus, the second DRAM device may store accurate rather than erroneous data. In some implementations, ECC may be used to recreate missing data in the second DRAM device.

Finally, in block 1312, processor 602 may cause reversion back to using the first DRAM device after the fuse is blown. Accesses of the failed row may be redirected to the spare row after the fuse is blown. In some implementations, the reversion back to using the first DRAM device may occur without a system reboot. For example, processor 602 may reverse DCK chip-sparing during runtime. In some implementations, the reversion may occur during reboot, and processor 602 may initialize the first DRAM device with the mapped-in spare row for use before an OS is loaded.

Figure 14:
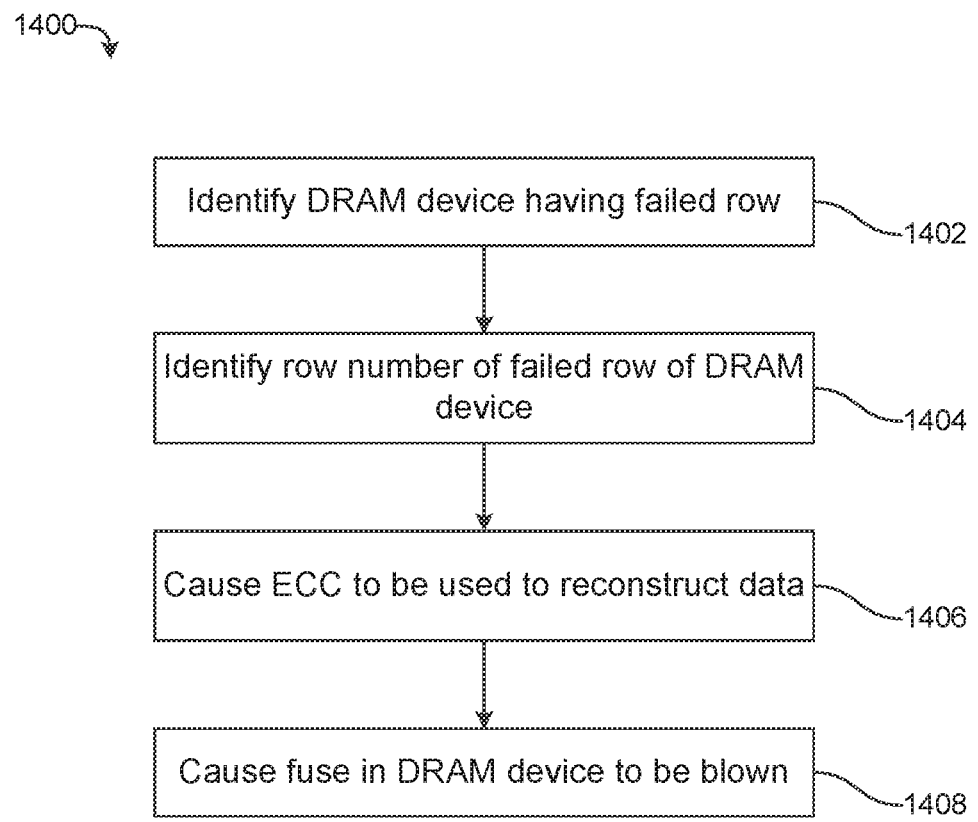
FIG. 14 is a flowchart of an example method for blowing a fuse in a DRAM device during runtime operation of the DRAM device.

FIG. 14 is a flowchart of an example method 1400 for blowing a fuse in a DRAM device during runtime operation of the DRAM device. Although execution of method 1400 is described below with reference to processor 702 of FIG. 7, it should be understood that execution of method 1400 may be performed by other suitable devices, such as processor 502 of FIG. 5. Method 1400 may be implemented in the form of executable instructions stored on a machine-readable storage medium and/or in the form of electronic circuitry.

Method 1400 may start in block 1402, where processor 702 may identify a DRAM device having a failed row. For example, records may be kept of how many errors (e.g., read/write errors) are associated with the DRAM device and which addresses/locations in the DRAM device were accessed when the errors occurred. The DRAM device may be identified as having a failed row when the number of errors associated with a region of the DRAM device exceeds a threshold number of errors.

In block 1404, processor 702 may identify a row number of the failed row of the DRAM device. In some implementations, processor 702 may write the row number to a register in a memory controller. Although block 1404 is shown below block 1402 in FIG. 14, it should be understood that elements of blocks 1402 and 1404 may be performed in parallel. The failed row may be excluded from utilization after being identified. Erroneous data that is read from the DRAM device (e.g., from the failed row) may appear in a position in a cache line.

In block 1406, processor 702 may cause ECC to be used to reconstruct data, for the position in which the erroneous data appears in the cache line, using data from other positions in the cache line. ECC may be used to reconstruct data while a fuse in the DRAM device is blown to replace the failed row with a spare row, during which time behavior of the DRAM device may be indeterminate. The ability to reconstruct data for one position in a cache line using data from other positions in the cache line may allow data read from the DRAM device to be ignored, and may allow a fuse in the DRAM device to be blown during runtime even if the DRAM device/failed row is not temporarily replaced (e.g., with a spare DRAM device or row buffer) while the fuse is blown.

In block 1408, processor 702 may cause a fuse in the DRAM device to be blown to replace the failed row with a spare row. In some implementations, processor 702 may write a register in a memory controller to cause the memory controller to send a command to the DRAM device to blow the fuse. The fuse may be blown during runtime operation of the DRAM device. Accesses of the failed row may be redirected to the spare row after the fuse is blown.

Figure 15:
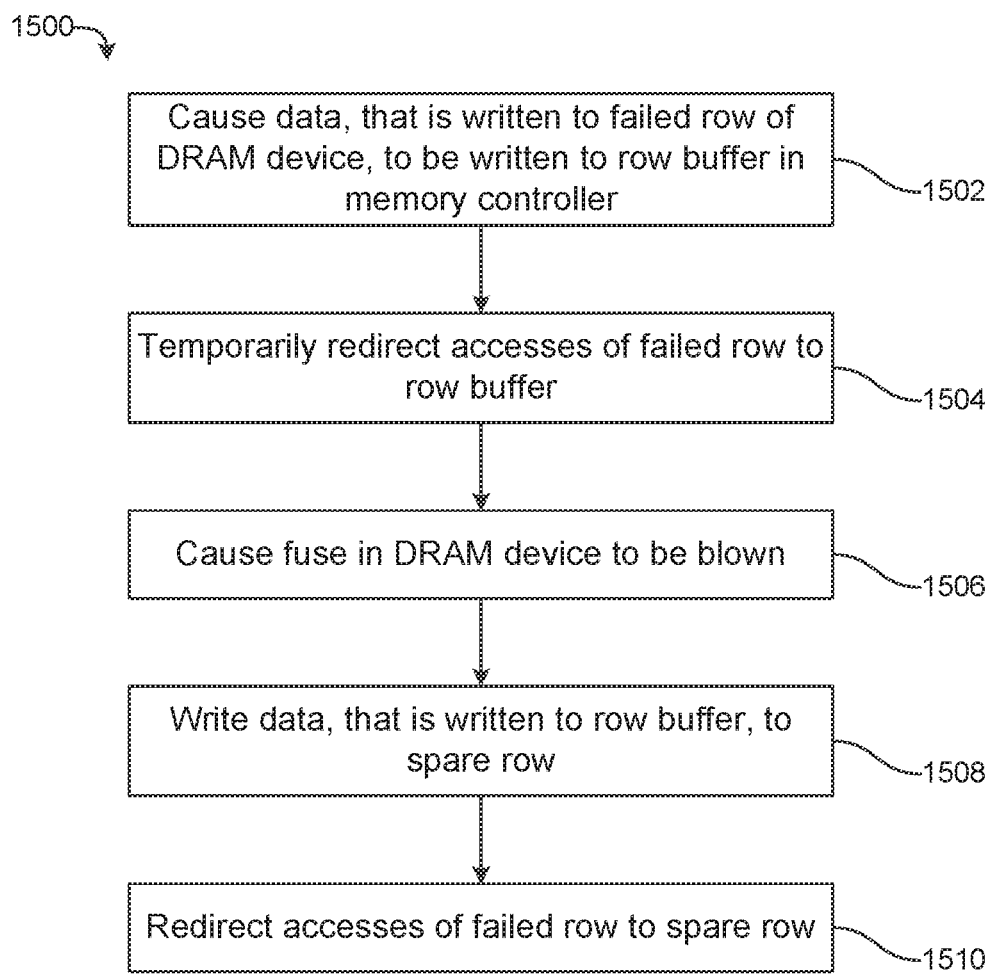
FIG. 15 a flowchart of an example method for temporarily replacing a failed row of a DRAM device with a row buffer in a memory controller.

FIG. 15 a flowchart of an example method 1500 for temporarily replacing a failed row of a DRAM device with a row buffer in a memory controller. Although execution of method 1500 is described below with reference to processor 802 of FIG. 8, it should be understood that execution of method 1500 may be performed by other suitable devices, such as processor 502 of FIG. 5. Method 1500 may be implemented in the form of executable instructions stored on a machine-readable storage medium and/or in the form of electronic circuitry.

Method 1500 may start in block 1502, where processor 802 may cause data, that is written to a failed row of a DRAM device, to be written to a row buffer in a memory controller. Data may be copied from the failed row to the row buffer. In some implementations, processor 802 may write a register in the memory controller to cause data, that is written to the failed row, to be written to the row buffer while data is copied from the failed row to the row buffer. The memory controller may have to access multiple cache lines before all data is copied from the failed row to the row buffer, as discussed above, and an OS/application may write to the failed row before all such cache lines are accessed. Writing data, that is written to the failed row, to the row buffer while data is copied from the failed row to the row buffer may allow the row buffer to have an up-to-date copy of data in the failed row when all accesses of the failed row are temporarily redirected to the row buffer. Memory addresses that rely on bits in the failed row may be accessed (e.g., using a patrol scrubber, BIOS, or OS driver) to copy data from the failed row to the row buffer, as discussed above.

In block 1504, processor 802 may temporarily redirect, to the row buffer, accesses of parts of the failed row that have been copied to the row buffer. Accesses of the failed row may be redirected to the row buffer before copying of data from the failed row to the row buffer is completed; while copying is in progress, accesses of parts of the failed row that have been copied may be redirected to the row buffer, and accesses of parts of the failed row that have not been copied may still occur. Processor 802 may control the copying of data from the failed row to the row buffer. When the copying is complete, processor 802 may send the memory controller an indication not to access the failed row. The row buffer may be used instead of the failed row while a fuse in the DRAM device is being blown to replace the failed row with a spare row of the DRAM device.

In block 1506, processor 802 may cause a fuse in the DRAM device to be blown to replace the failed row with a spare row. In some implementations, processor 802 may write a register in a memory controller to cause the memory controller to send a command to the DRAM device to blow the fuse. The fuse may be blown during runtime operation of the DRAM device.

In block 1508, processor 802 may write data, that is written to the row buffer, to the spare row. Data may be copied from the row buffer to the spare row after the fuse is blown. In some implementations, processor 802 may write a register in the memory controller to cause data, that is written to the row buffer, to be written to the spare row while data is copied from the row buffer to the spare row. The memory controller may have to access multiple cache lines before all data is copied from the row buffer to the spare row, as discussed above, and an OS/application may attempt to write to the failed row (such an attempt may be redirected to the row buffer) before all such cache lines are accessed. Writing data, that is written to the row buffer, to the spare row while data is copied from the row buffer to the spare row may allow the spare row to have an up-to-date copy of data in the row buffer when all accesses of the failed row are redirected to the spare row. Memory addresses that rely on bits in the failed row may be accessed (e.g., using a patrol scrubber, BIOS, or OS driver) to copy data from the row buffer to the spare row, as discussed above.

In block 1510, processor 802 may redirect, to the spare row, accesses of parts of the failed row that have been copied from the row buffer to the spare row. Accesses of the failed row may be redirected to the spare row before copying of data from the row buffer to the spare row is completed; while copying is in progress, accesses of parts of the failed row that have been copied from the row buffer to the spare row may be redirected to the spare row, and accesses of parts of the failed row that have not been copied from the row buffer to the spare row may be redirected to the row buffer. Processor 802 may control the copying of data from the row buffer to the spare row. When the copying is complete, processor 802 may send the memory controller an indication not to use the row buffer.

The foregoing disclosure describes DRAM row sparing during runtime. Example implementations described herein enable replacement of a failed row of a DRAM device during runtime, even if applications continue to use the DRAM device while a fuse is being blown, and even without OS support of row sparing during runtime.

We claim:

1. A method for dynamic random-access memory (DRAM) row sparing, the method comprising:
   during runtime operation of a DRAM device, responsive to identifying a failed row of the DRAM device:
   copying first data stored in the failed row to an other storage location such that second data that corresponds to the first data is stored in the other storage location, and temporarily redirecting accesses of the failed row to the other storage location until a fuse in the DRAM device has been blown to replace the failed row with a spare row;
   transmitting instructions to blow the fuse to replace the failed row with the spare row;
   using, while the fuse is being blown, error-correcting code (ECC) to correct erroneous parts of the second data stored in the other storage location; and
   after the fuse is blown, copying the second data from the other storage location to the spare row and redirecting accesses of the failed row to the spare row.

2. The method of claim 1, wherein:
   the DRAM device is a first DRAM device of a plurality of DRAM devices and the other data storage location is part of a second DRAM device of the plurality of DRAM devices;
   temporarily redirecting accesses of the failed row to the other storage location comprises temporarily replacing the first DRAM device with the second DRAM device;
   the first data is copied from the first DRAM device to the second DRAM device before the first DRAM device is replaced; and
   the method further comprising reverting back to using the first DRAM device after the fuse is blown.

3. The method of claim 2, wherein the reverting back to using the first DRAM device occurs during a system reboot.

4. The method of claim 1,
   wherein the other storage location is a row buffer in the DRAM device, and
   the copying of the second data from the other storage location to the spare row comprises copying, after the fuse is blown, the second data from the row buffer to the spare row.

5. The method of claim 1,
   wherein the other storage location is a row buffer in a memory controller.

6. The method of claim 1,
   wherein temporarily redirecting accesses of the failed row to the other storage location includes, while the copying of the first data from the failed row to the other storage location is still ongoing, redirecting to the other storage location accesses of those parts of the failed row that have been copied to the other storage location.

7. The method of claim 6, comprising:
while the copying of the first data from the failed row to the other storage location is still ongoing, directing to the failed row accesses of those parts of the failed row that have not yet been copied to the other storage location.

8. The method of claim 1,
wherein redirecting accesses of the failed row to the spare row includes, while the copying of the second data from the other storage location to the spare row is still ongoing, redirecting to the spare row accesses of those parts of the failed row for which corresponding parts of the second data have been copied from the other storage location to the spare row.

9. The method of claim 8, comprising:
while the copying of the second data from the other storage location to the spare row is still ongoing, directing to the other storage location accesses of those parts of the failed row for which corresponding parts of the second data have not yet been copied from the other storage location to the spare row.

10. A non-transitory machine-readable storage medium encoded with instructions executable by a processor of a memory controller for dynamic random-access memory (DRAM) row sparing, the machine-readable storage medium comprising:
instructions to, during runtime operation of a DRAM device, copy first data stored in a failed row to an other storage location such that second data that corresponds to the first data is stored in the other storage location, and temporarily redirect accesses of the failed row to the other storage location until a fuse in the DRAM device has been blown to replace the failed row with a spare row;
instructions to blow, during runtime operation of the DRAM device, the fuse to replace the failed row with the spare row;
instructions to use, while the fuse is being blown, error-correcting code (ECC) to correct erroneous parts of the second data stored in the other storage location; and
instructions to, after the fuse is blown, copy the second data from the other storage location to the spare row and redirect accesses of the failed row to the spare row.

11. The machine-readable storage medium of claim 10,
wherein the DRAM device is a first DRAM device of a plurality of DRAM devices and the other data storage location is part of a second DRAM device of the plurality of DRAM devices,
the instructions redirect accesses of the failed row to the other storage location include instructions to replace the first DRAM device with the second DRAM device, and
the machine-readable storage medium further comprising instructions to revert back to using the first DRAM device after the fuse is blown.

12. The machine-readable storage medium of claim 10,
wherein the other storage location is a row buffer in the DRAM device.

13. The machine-readable storage medium of claim 10,
wherein the other storage location is a row buffer in a memory controller.

14. The non-transitory machine-readable of claim 10,
wherein temporarily redirecting accesses of the failed row to the other storage location includes, while the copying of the first data from the failed row to the other storage location is still ongoing, redirecting to the other storage location accesses of those parts of the failed row that have been copied to the other storage location.

15. The non-transitory machine-readable of claim 14, comprising instructions to:
while the copying of the first data from the failed row to the other storage location is still ongoing, direct to the failed row accesses of those parts of the failed row that have not yet been copied to the other storage location.

16. The non-transitory machine-readable of claim 10,
wherein redirecting accesses of the failed row to the spare row includes, while the copying of the second data from the other storage location to the spare row is still ongoing:
redirecting to the spare row accesses of those parts of the failed row for which corresponding parts of the second data have been copied from the other storage location to the spare row; and
directing to the other storage location accesses of those parts of the failed row for which corresponding parts of the second data have not yet been copied from the other storage location to the spare row.

17. A non-transitory machine-readable storage medium encoded with instructions executable by a processor for dynamic random-access memory (DRAM) row sparing, the machine-readable storage medium comprising:
instructions to identify a DRAM device having a failed row;
instructions to identify a row number of the failed row of the DRAM device;
instructions to, responsive to identifying the failed row, during runtime operation of the DRAM device:
copy first data stored in the failed row to an other storage location such that second data that corresponds to the first data is stored in the other storage location;
temporarily redirect accesses of the failed row to the other storage location until a fuse in the DRAM device has been blown to replace the failed row with a spare row;
blow the fuse to replace the failed row with the spare row;
while the fuse is being blown, use error-correcting code (ECC) to correct erroneous parts of the second data stored in the other storage location; and
after the fuse is blown, copy the second data from the other storage location to the spare row and redirect accesses of the failed row to the spare row.

18. The machine-readable storage medium of claim 17,
wherein the DRAM device is a first DRAM device of a plurality of DRAM devices and the other data storage location is part of a second DRAM device of the plurality of DRAM devices,
the instructions to temporarily redirect accesses of the failed row to the other storage location include instructions to replace the first DRAM device with the second DRAM device, wherein the first data is copied from the first DRAM device to the second DRAM device before the first DRAM device is replaced, and
the machine-readable storage medium further comprises:
instructions to revert back to using the first DRAM device after the fuse is blown.

19. The machine-readable storage medium of claim 17,
wherein the other storage location is a row buffer in a memory controller.

20. The machine-readable storage medium of claim 17, wherein the other storage location is a row buffer in the DRAM device.

\* \* \* \* \*